US010957647B2

(12) United States Patent
Lee et al.

(10) Patent No.: US 10,957,647 B2
(45) Date of Patent: Mar. 23, 2021

(54) INTEGRATED CIRCUIT DEVICES INCLUDING A BORON-CONTAINING INSULATING PATTERN

(71) Applicant: Samsung Electronics Co., Ltd., Suwon-si (KR)

(72) Inventors: Dong-kak Lee, Yongin-si (KR); Yoon-ho Son, Hwaseong-si (KR); Mong-sup Lee, Hwaseong-si (KR); Wook-yeol Yi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/358,212

(22) Filed: Mar. 19, 2019

(65) Prior Publication Data

US 2020/0051921 A1 Feb. 13, 2020

(30) Foreign Application Priority Data

Aug. 13, 2018 (KR) ........................ 10-2018-0094613

(51) Int. Cl.
| | | |
|---|---|---|
| *H01L 23/532* | (2006.01) | |
| *H01L 27/108* | (2006.01) | |
| *H01L 23/522* | (2006.01) | |
| *H01L 21/762* | (2006.01) | |
| *H01L 21/768* | (2006.01) | |

(52) U.S. Cl.
CPC .. *H01L 23/53295* (2013.01); *H01L 21/76232* (2013.01); *H01L 21/76805* (2013.01); *H01L 21/76831* (2013.01); *H01L 21/76832* (2013.01); *H01L 23/5226* (2013.01); *H01L 27/10814* (2013.01); *H01L 27/10855* (2013.01)

(58) Field of Classification Search
None
See application file for complete search history.

(56) References Cited

U.S. PATENT DOCUMENTS

| | | | |
|---|---|---|---|
| 6,468,859 B1 * | 10/2002 | Parekh | H01L 21/76802 |
| | | | 257/E21.013 |
| 7,064,061 B2 | 6/2006 | Passemard et al. | |
| 7,514,336 B2 | 4/2009 | Nanda et al. | |
| 8,030,707 B2 | 10/2011 | Cheng et al. | |
| 9,496,381 B2 * | 11/2016 | Lee | H01L 27/10885 |
| 9,905,512 B2 * | 2/2018 | Iwasaki | H01L 23/5256 |
| 2009/0098741 A1 * | 4/2009 | Tanaka | H01L 21/02123 |
| | | | 438/791 |
| 2016/0276270 A1 * | 9/2016 | Iwasaki | H01L 23/5256 |
| 2017/0229341 A1 | 8/2017 | Chang et al. | |
| 2020/0051921 A1 * | 2/2020 | Lee | H01L 23/53295 |

FOREIGN PATENT DOCUMENTS

| | | |
|---|---|---|
| KR | 10-2006-0065185 | 6/2006 |
| KR | 10-0707800 | 4/2007 |
| KR | 10-2014-0003089 | 1/2014 |

\* cited by examiner

*Primary Examiner* — Long Pham
(74) *Attorney, Agent, or Firm* — Myers Bigel, P.A.

(57) ABSTRACT

Integrated circuit (IC) devices are provided. An IC device includes a substrate including an active region. The IC device includes a bit line on the substrate. The IC device includes a direct contact connected between the active region and the bit line. The IC device includes a contact plug on the substrate. Moreover, the IC device includes a boron-containing insulating pattern between the contact plug and the direct contact.

19 Claims, 45 Drawing Sheets

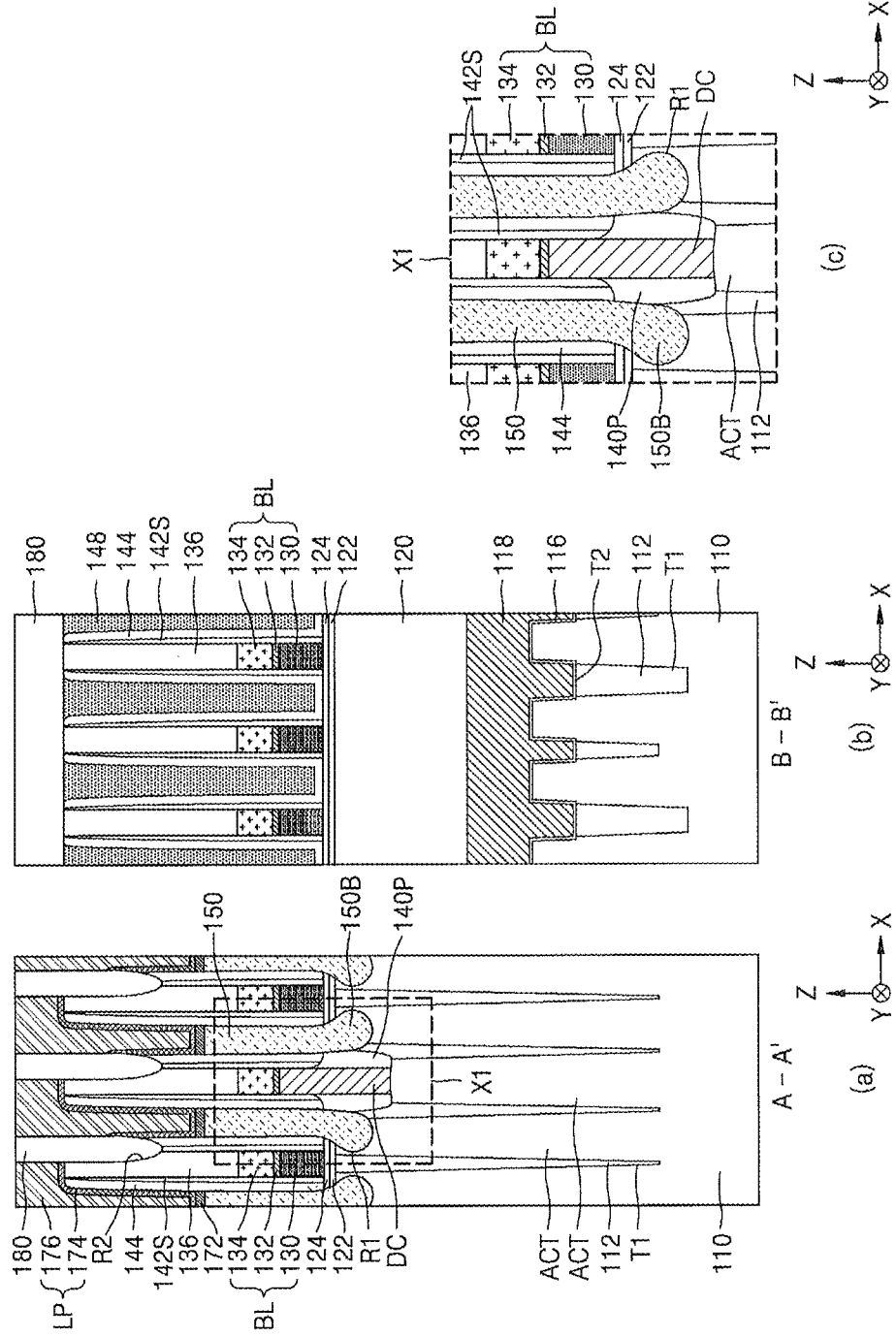

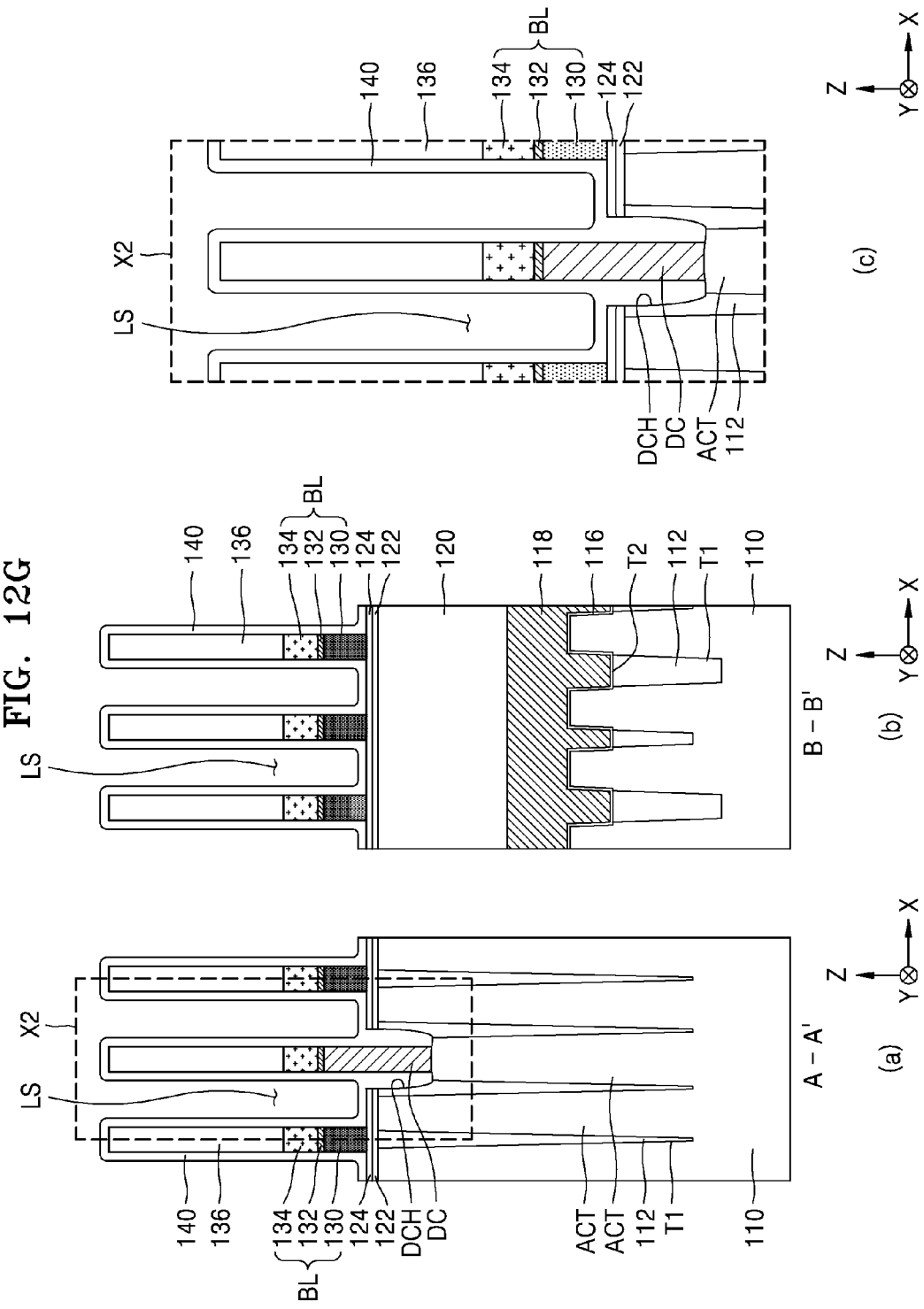

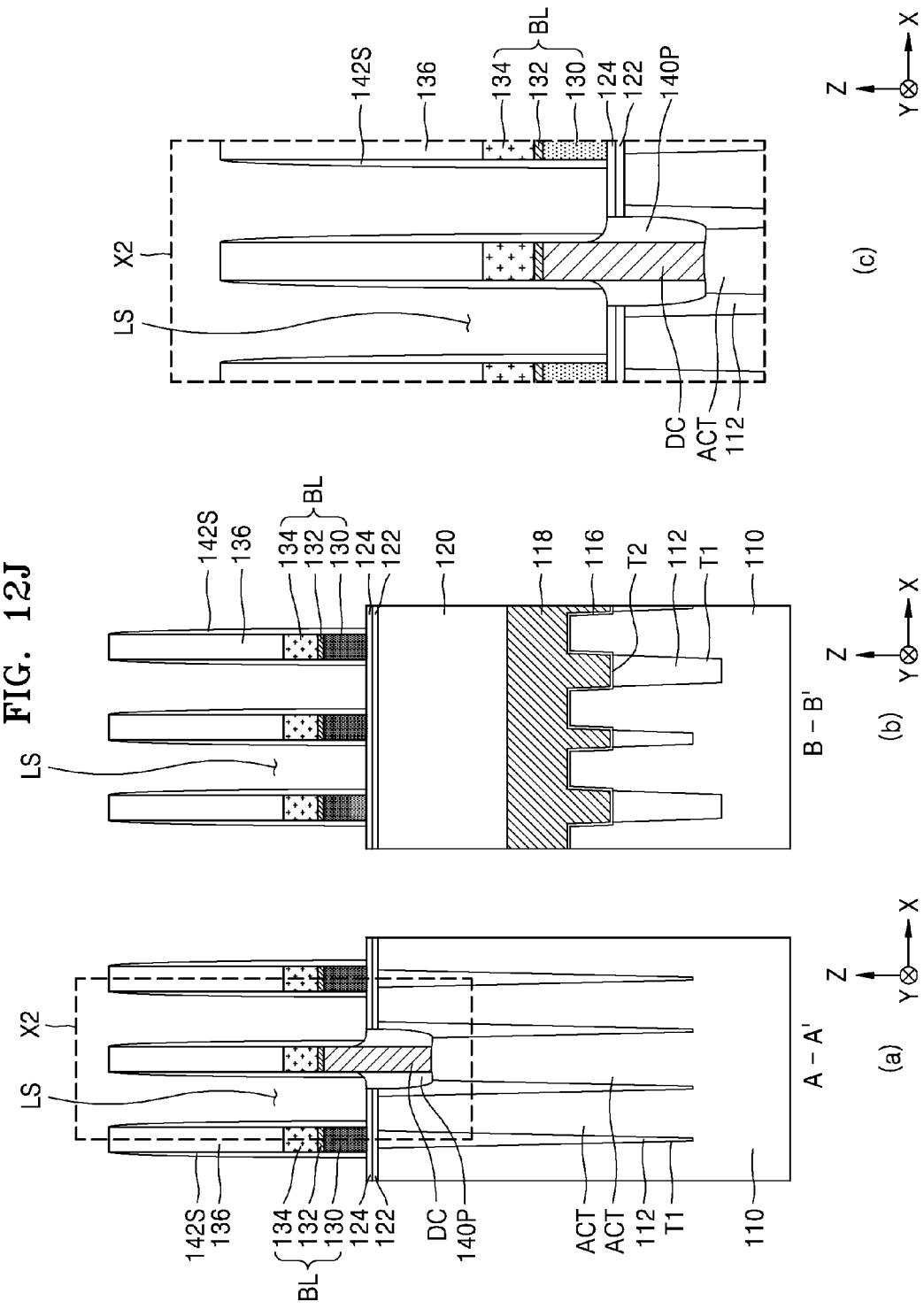

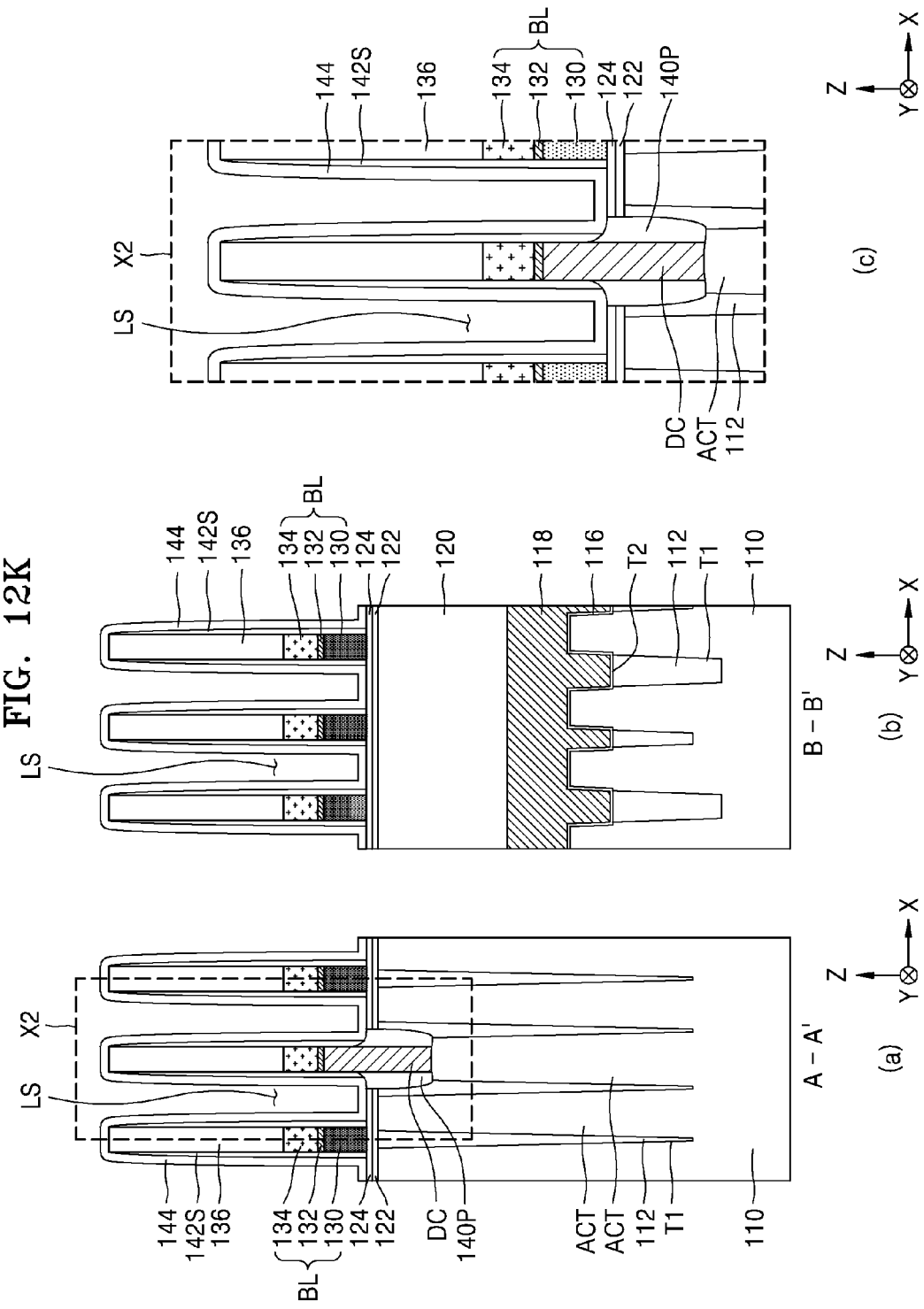

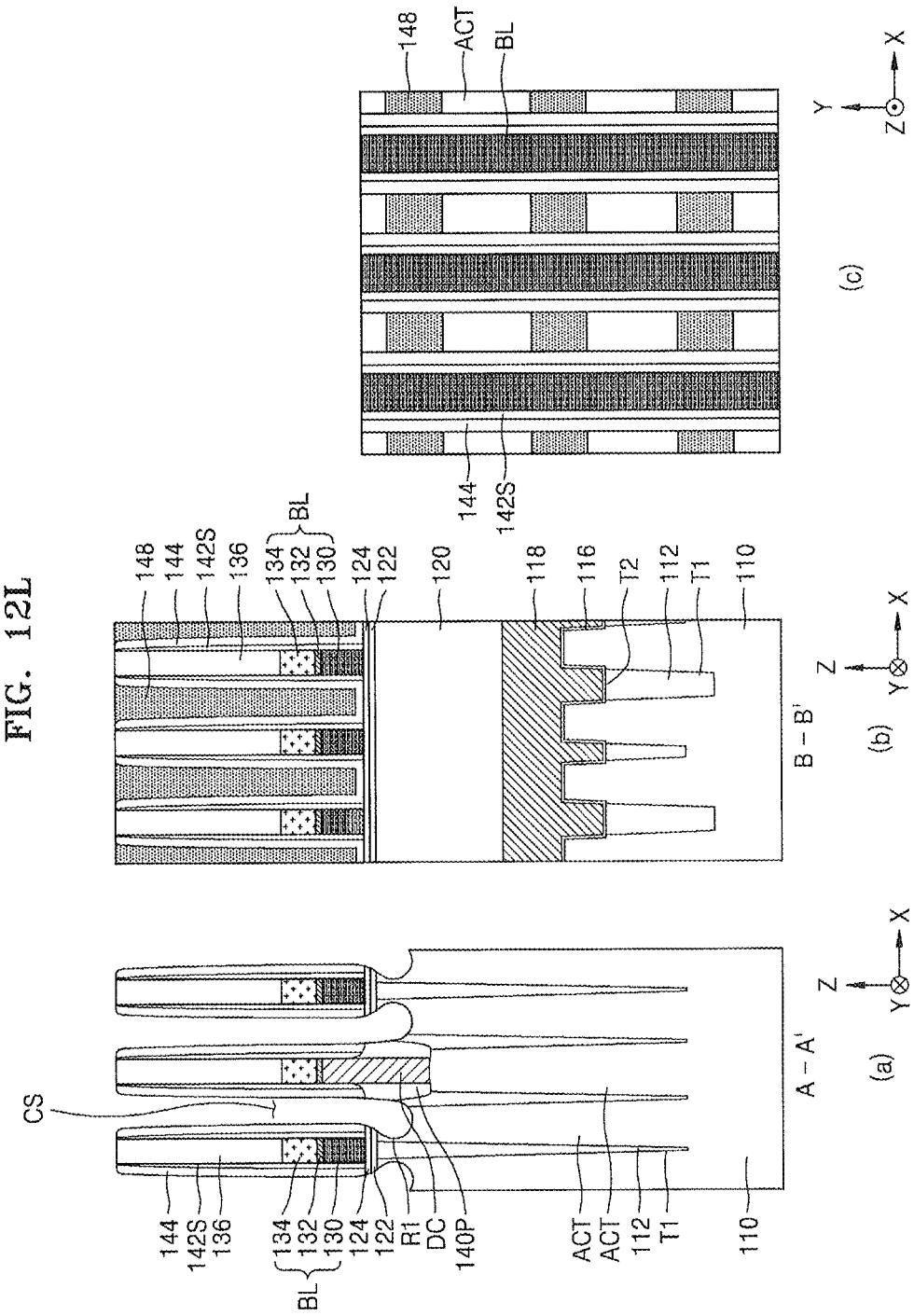

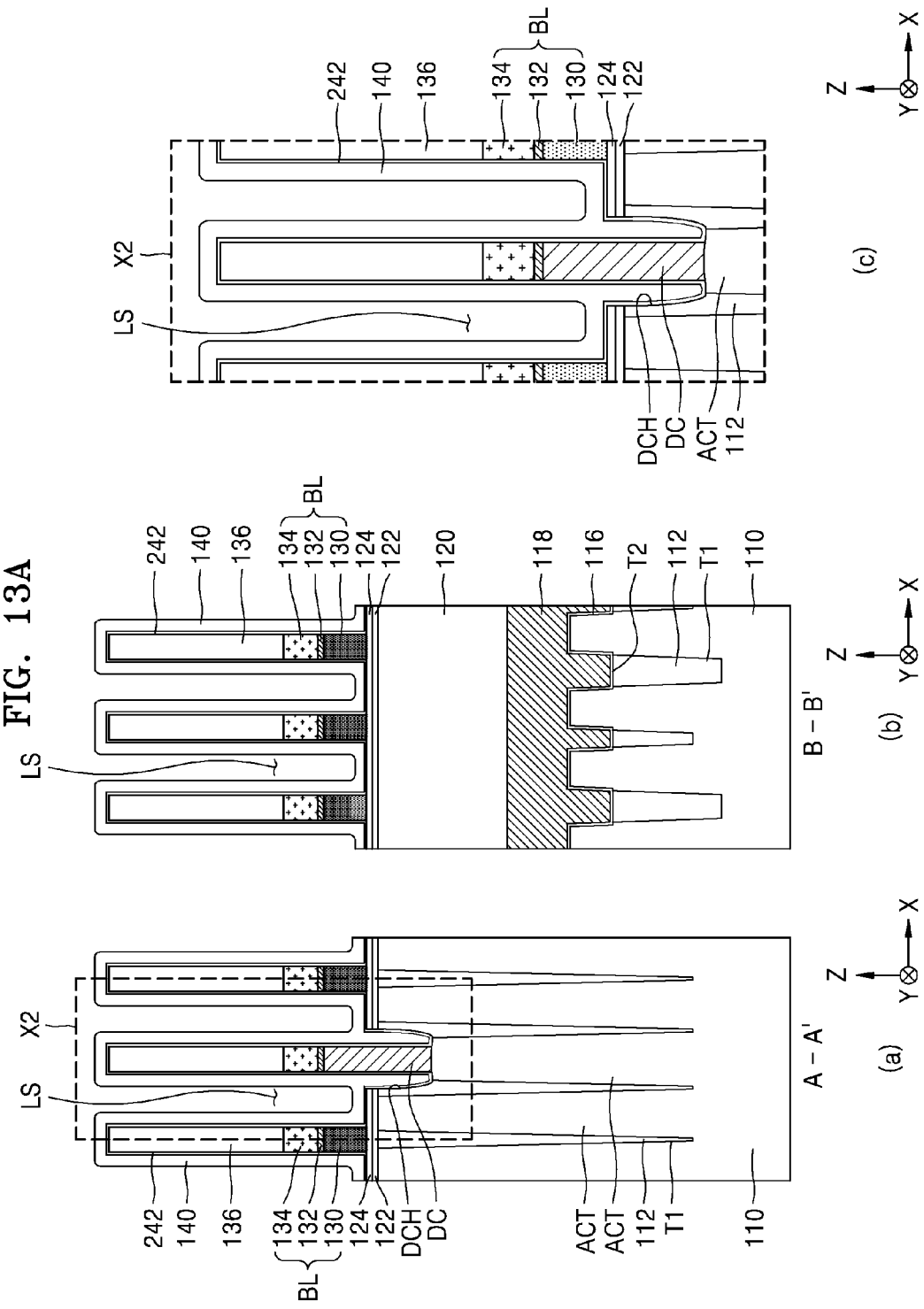

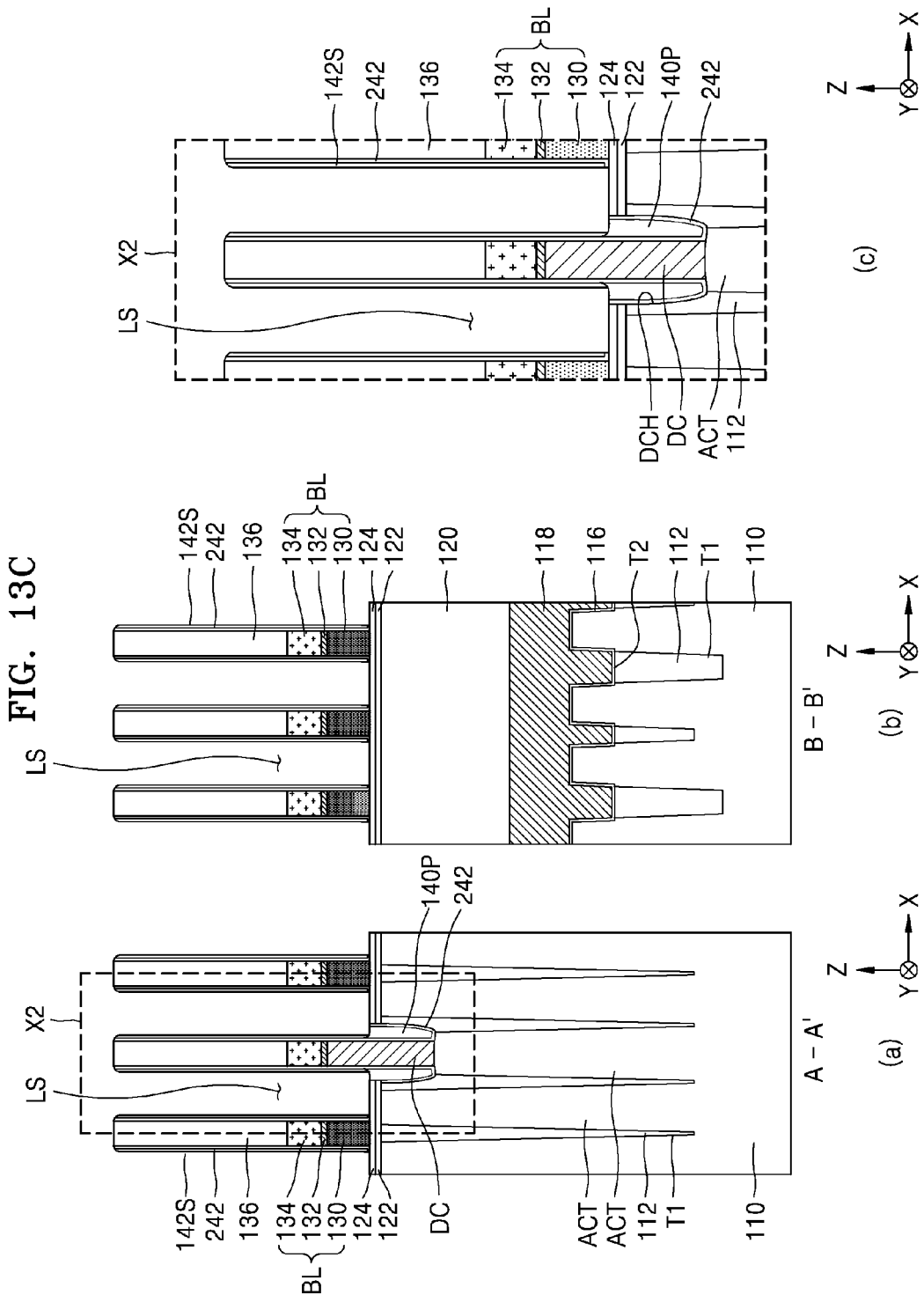

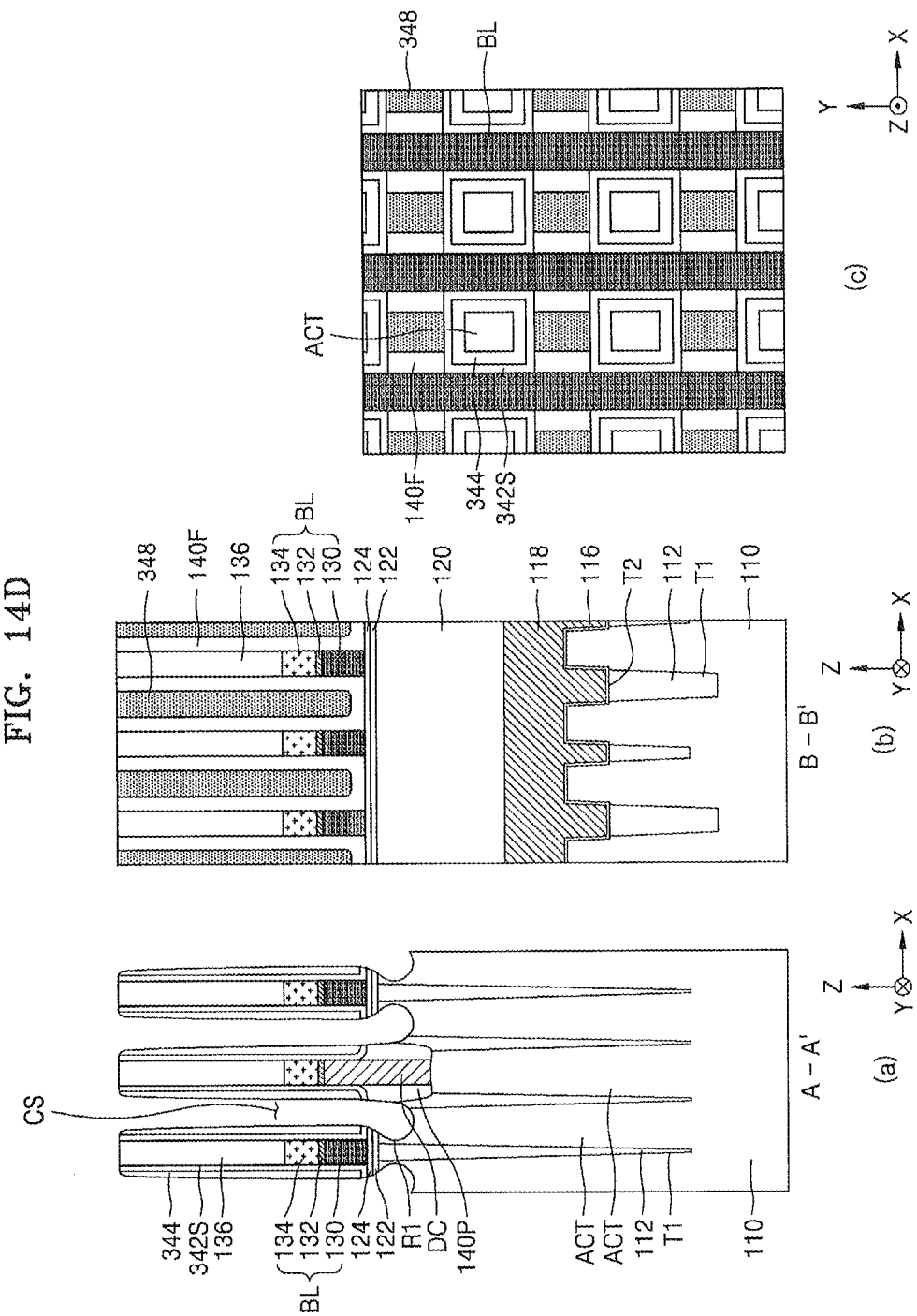

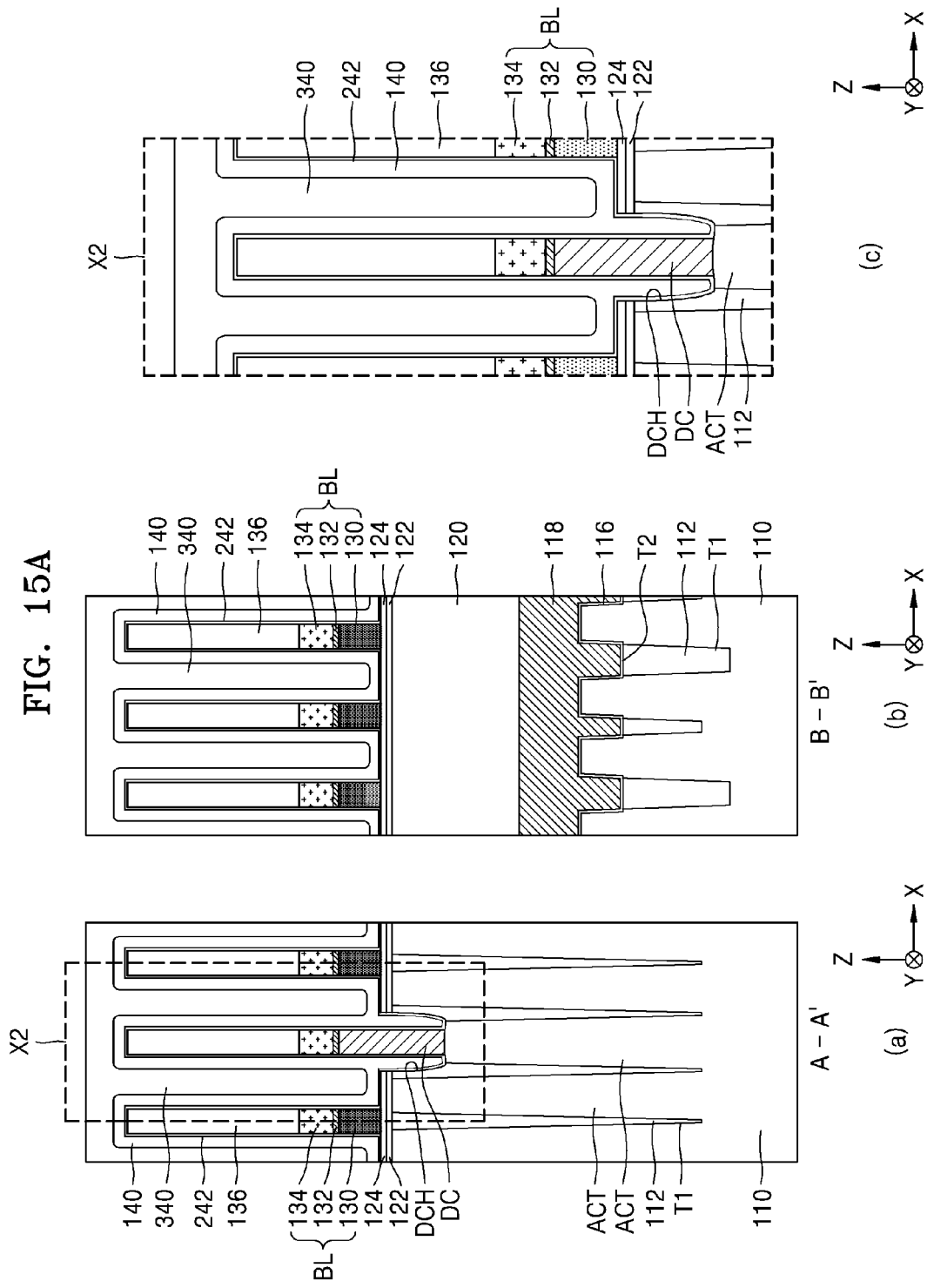

INTEGRATED CIRCUIT DEVICES INCLUDING A BORON-CONTAINING INSULATING PATTERN

CROSS-REFERENCE TO RELATED APPLICATION

This application claims the benefit of Korean Patent Application No. 10-2018-0094613, filed on Aug. 13, 2018, in the Korean Intellectual Property Office, the disclosure of which is hereby incorporated herein in its entirety by reference.

BACKGROUND

The present disclosure relates to an integrated circuit (IC) device, and more particularly, to an IC device including a plurality of conductive patterns located adjacent to each other. In recent years, as the downscaling of IC devices has rapidly progressed, a distance between a plurality of interconnection lines has become narrower and thus, a distance between the plurality of interconnection lines and a contact plug interposed between the plurality of interconnection lines has been gradually reduced. Thus, a parasitic capacitance between the contact plug and the plurality of interconnection lines has increased, and the likelihood of an electrical short between the contact plug and a conductive region adjacent thereto has also increased.

SUMMARY

The inventive concepts provide an integrated circuit (IC) device, which may have a reduced (e.g., miniaturized) unit cell size with the downscaling of IC devices, and may reduce a parasitic capacitance between contact plugs formed in a limited area and conductive lines located adjacent to the contact plugs and reduce the likelihood of an electrical short between adjacent conductive regions to improve reliability.

According to some embodiments of the inventive concepts, an IC device is provided. The IC device may include a substrate including a first active region and a second active region that are spaced apart from each other. The IC device may include a bit line that extends in a horizontal direction on the substrate. The IC device may include a direct contact connected between the first active region and the bit line. The IC device may include a contact plug that extends in a vertical direction on the substrate. The contact plug may include an upper portion adjacent the bit line and a lower portion in contact with the second active region in the substrate. Moreover, the IC device may include a boron-containing insulating pattern between the lower portion of the contact plug and the direct contact.

An IC device, according to some embodiments of the inventive concepts, may include a substrate including a plurality of active regions spaced apart from each other. The IC device may include a bit line extending in a horizontal direction on the substrate. The IC device may include a plurality of contact plugs spaced apart from each other along a horizontal line parallel to the bit line on the substrate. The IC device may include a plurality of insulating fences that alternate with the plurality of contact plugs in the horizontal direction. The IC device may include a direct contact connected between a first active region of the plurality of active regions and the bit line. Moreover, the IC device may include a boron-containing insulating pattern between a first contact plug of the plurality of contact plugs and the direct contact.

An IC device, according to some embodiments of the inventive concepts, may include a substrate including a plurality of active regions. The IC device may include a bit line extending in a horizontal direction on the substrate. The IC device may include a direct contact connected between a first active region of the plurality of active regions and the bit line. The IC device may include a first contact plug and a second contact plug that face each other with the bit line therebetween. The first contact plug and the second contact plug may be connected to a second active region and a third active region, respectively, of the plurality of active regions. The IC device may include a first insulating fence and a second insulating fence that face each other with the bit line therebetween. Moreover, the IC device may include a plurality of boron-containing insulating patterns. The plurality of boron-containing insulating patterns may include a first boron-containing insulating pattern between the direct contact and the first contact plug and a second boron-containing insulating pattern between the direct contact and the second contact plug. Each of the plurality of boron-containing insulating patterns may include a silicon boron nitride (SiBN) film.

BRIEF DESCRIPTION OF THE DRAWINGS

Embodiments of the inventive concepts will be more clearly understood from the following detailed description taken in conjunction with the accompanying drawings in which:

FIG. 2A shows cross-sectional views of an IC device according to embodiments;

FIGS. 13A to 13D show cross-sectional views of a process sequence of a method of manufacturing an IC device according to embodiments;

FIGS. 14A to 14E are diagrams of a process sequence of a method of manufacturing an IC device according to embodiments; and FIGS. 15A to 15E are diagrams of a process sequence of a method of manufacturing an IC device according to embodiments.

DETAILED DESCRIPTION

Figure 1:
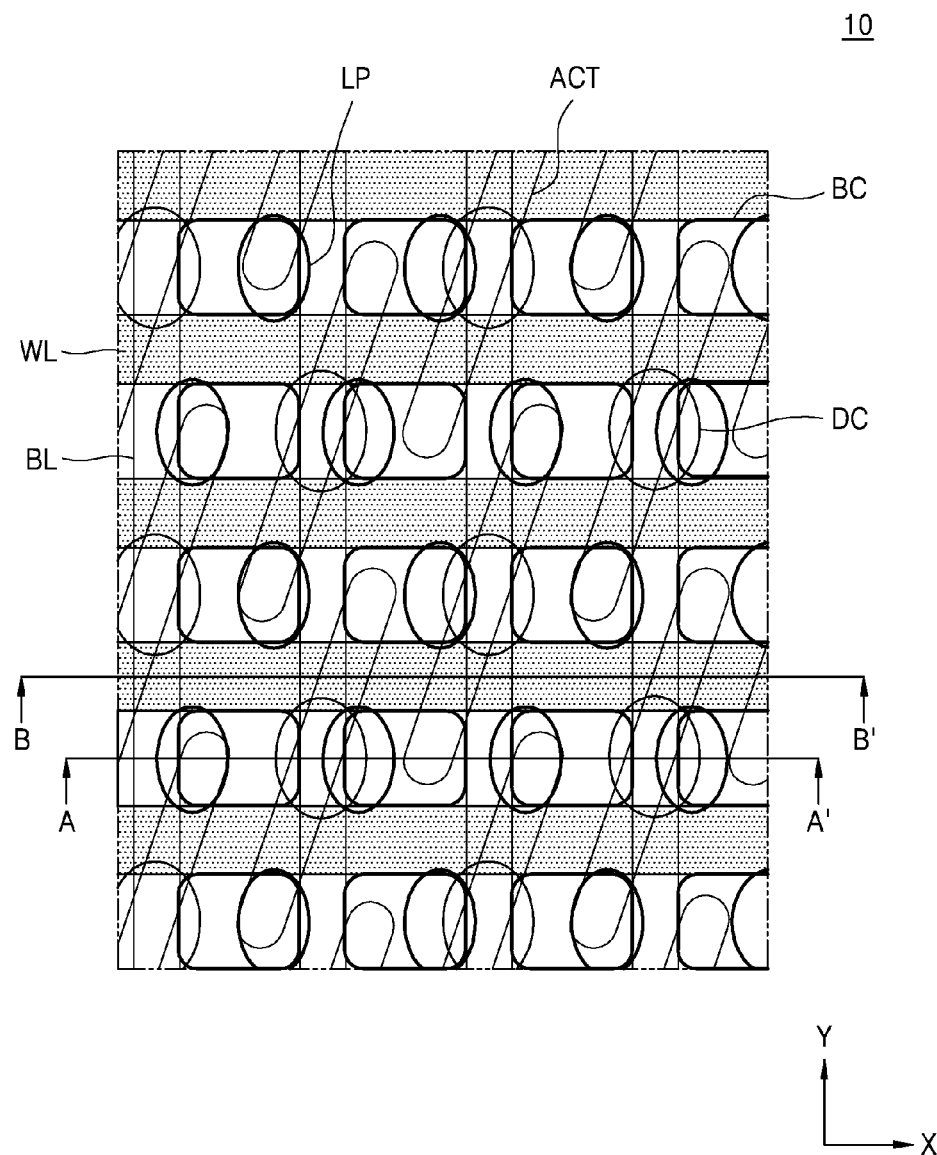
FIG. 1 shows a layout of main components of a memory cell array region of an integrated circuit (IC) device according to embodiments.

FIG. 1 shows a layout of main components of a memory cell array region of an integrated circuit (IC) device 10 according to embodiments.

Referring to FIG. 1, the IC device 10 may include a plurality of active regions ACT, which may be spaced apart from each other. The plurality of active regions ACT may be arranged at an angle to each of an X direction and a Y direction on the plane and extend in a horizontal direction. A plurality of word lines WL may intersect the plurality of active regions ACT and extend parallel to each other in the X direction. A plurality of bit lines BL may be located on the plurality of word lines WL and extend parallel to each other in the Y direction intersecting the X direction. The plurality of bit lines BL may be connected to the plurality of active regions ACT through one or more direct contacts DC.

A plurality of buried contacts BC may be formed between two adjacent ones of the plurality of bit lines BL. A plurality of conductive landing pads LP may be formed on the plurality of buried contacts BC. The plurality of buried contacts BC and the plurality of conductive landing pads LP may serve to connect lower electrodes of capacitors formed on the plurality of bit lines BL with the active regions ACT. At least a portion of each of the plurality of conductive landing pads LP may vertically overlap the buried contact BC.

Next, configurations of IC devices according to example embodiments will be described with reference to FIGS. 2A to 11. Each of the IC devices shown in FIGS. 2A to 11 may have the layout of the IC device 10 shown in FIG. 1. In FIGS. 2A, 3A, 4A, 5A, 7A, 8A, 9A, and 10A, (a) is a cross-sectional view of some components of a portion corresponding to a cross-section taken along a line A-A' of FIG. 1, (b) is a cross-sectional view of some components of a portion corresponding to a cross-section taken along a line B-B' of FIG. 1, and (c) is an enlarged cross-sectional view of a portion corresponding to a dashed region indicated by "X1" in (a).

Figure 2B:
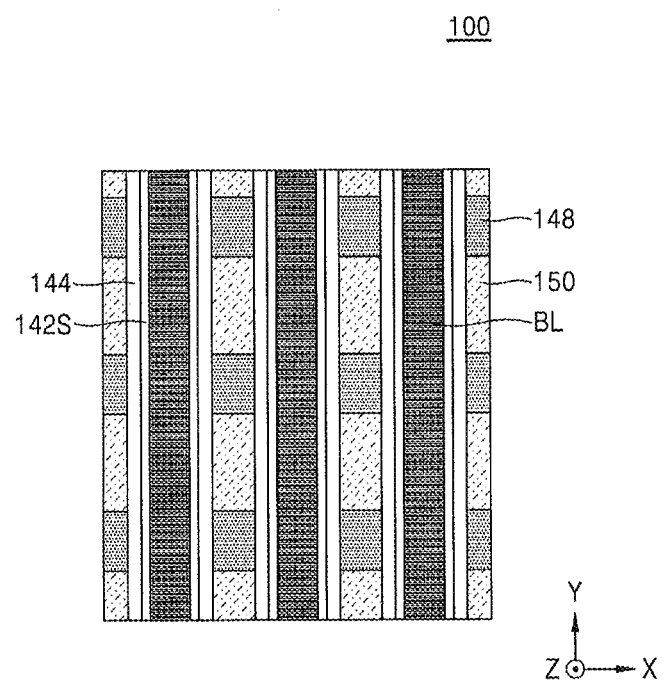
FIG. 2B is an enlarged plan view of a partial region of FIG. 2A.

FIG. 2A shows cross-sectional views of an IC device 100 according to embodiments, and FIG. 2B is an enlarged plan view of a partial region of FIG. 2A.

Referring to FIGS. 2A and 2B, the IC device 100 may include a substrate 110 in which a plurality of active regions ACT are defined by a device isolation film 112. The device isolation film 112 may be formed in a device isolation trench T1 formed in the substrate 110.

The substrate 110 may include silicon, for example, single crystalline silicon, polycrystalline silicon, or amorphous silicon. In some embodiments, the substrate 110 may include at least one selected out of germanium (Ge), silicon germanium (SiGe), silicon carbide (SiC), gallium arsenide (GaAs), indium arsenide (InAs), and indium phosphide (InP). In some embodiments, the substrate 110 may include a conductive region, for example, a doped well or a doped structure.

A plurality of word line trenches T2 may be formed in the substrate 110 and extend in a first horizontal direction (X direction), and a plurality of gate dielectric films 116, a plurality of word lines 118, and a buried insulating film 120 may be formed inside the plurality of word line trenches T2. The plurality of word lines 118 may correspond to the plurality of word lines WL shown in FIG. 1.

A first insulating film 122 and a second insulating film 124 may be sequentially formed on the substrate 110. The first insulating film 122 and the second insulating film 124 may include silicon oxide, silicon nitride, or a combination thereof. In some embodiments, the first insulating film 122 may include silicon oxide, and the second insulating film 124 may include silicon nitride. A plurality of bit lines BL may be formed on the second insulating film 124 and extend in a second horizontal direction (Y direction) to be parallel to each other.

A direct contact DC may be formed on a partial region of each of the plurality of active regions ACT. Each of the plurality of bit lines BL may be connected to the active region ACT through the direct contact DC. In some embodiments, the direct contact DC may include silicon (Si), germanium (Ge), tungsten (W), tungsten nitride (WN), cobalt (Co), nickel (Ni), aluminium (Al), molybdenum (Mo), ruthenium (Ru), titanium (Ti), titanium nitride (TiN), tantalum (Ta), tantalum nitride (TaN), copper (Cu), or a combination thereof. Accordingly, the direct contact DC may include a metal and/or a semiconductor material. In some embodiments, the direct contact DC may include an epitaxial silicon layer.

The plurality of bit lines BL may include a lower conductive layer 130, a middle conductive layer 132, and an upper conductive layer 134, which are sequentially formed on the substrate 110. Each of the plurality of bit lines BL may be covered by an insulating capping pattern 136. A top surface of the lower conductive layer 130 may be coplanar with a top surface of the direct contact DC. Although FIG. 2A illustrates an example in which each of the plurality of bit lines BL has a triple structure including the lower conductive layer 130, the middle conductive layer 132, and the upper conductive layer 134, the inventive concepts are not limited thereto. For example, each of the plurality of bit lines BL may be formed as a single layer, a double layer, or a multi-layered stack structure including at least four layers.

In some embodiments, the lower conductive layer 130 may include a conductive polysilicon. Each of the middle conductive layer 132 and the upper conductive layer 134 may include titanium nitride (TiN), titanium silicon nitride (TiSiN), tungsten (W), tungsten silicide, or a combination thereof. For example, the middle conductive layer 132 may include TiN and/or TiSiN, and the upper conductive layer 134 may include W. The insulating capping pattern 136 may include a silicon nitride film.

A plurality of contact plugs 150 may be formed in spaces between the respective bit lines BL. Each of the plurality of contact plugs 150 may have a pillar shape that may extend in a vertical direction (Z direction) upward from the substrate 110. Each of the plurality of contact plugs 150 may have a bottom (i.e., lower) portion 150B in contact with the active region ACT. The bottom portion 150B of each of the plurality of contact plugs 150 may be located at a lower level than a top surface of the substrate 110 and buried in the substrate 110. For example, the bottom portion 150B of a contact plug 150 may be lower than an upper portion of the contact plug 150 that is adjacent a bit line BL (e.g., an upper portion that is between two bit lines BL). The plurality of contact plugs 150 may include a doped semiconductor material, a metal, a conductive metal nitride, or a combination thereof, but are not limited thereto.

In the IC device 100, one direct contact DC and a pair of contact plugs 150, which may face each other with the one direct contact DC therebetween, may be connected to different respective active regions AC of the plurality of active regions AC.

A plurality of insulating fences 148 and the plurality of contact plugs 150 may be alternately arranged one by one along a straight line parallel to a direction (Y direction) in which the bit line BL extends, between a pair of bit lines BL. The plurality of contact plugs 150 may be insulated from each other by a plurality of insulating fences 148. Each of the plurality of insulating fences 148 may have a pillar shape that may extend in a vertical direction (Z direction) from the substrate 110. In some embodiments, the plurality of insulating fences 148 may include a silicon nitride film, but are not limited thereto.

The IC device 100 may include a boron (B)-containing insulating filling pattern 140P interposed between the contact plug 150 and the direct contact DC. The boron-containing insulating filling pattern 140P may be in contact with the bottom portion 150B of the contact plug 150 and the direct contact DC. At least a portion of the boron-containing insulating filling pattern 140P may be buried in the substrate 110. A bottom level of the boron-containing insulating filling pattern 140P may be lower than a top level of the substrate 110, and a top level of the boron-containing insulating filling pattern 140P may be equal to or higher than the top level of the substrate 110. The pattern 140P does not necessarily completely fill a particular region, however, and thus may be referred to herein as a "boron-containing insulating pattern."

The boron-containing insulating filling pattern 140P may have a dielectric constant of about 2 to 6. For example, the boron-containing insulating filling pattern 140P may have a dielectric constant of about 3 to 5. In some embodiments, the boron-containing insulating filling pattern 140P may include a silicon boron nitride (SiBN) film. A boron content of the SiBN film included in the boron-containing insulating filling pattern 140P may range from about 10 atomic percent (at %) to about 50 at %. For example, the boron-containing insulating filling pattern 140P may include $Si_xB_yN_z$ ($0.1 \le x \le 0.5$, $0.1 \le y \le 0.5$, and $0.1 \le z \le 0.8$).

In the IC device 100, the boron-containing insulating filling pattern 140P having a relatively low dielectric constant may be interposed between the direct contact DC and the bottom portion 150B of the contact plug 150, which may be adjacent to each other (i.e., do not have another direct contact DC or contact plug 150 therebetween). Thus, an undesired parasitic capacitance may be reduced between the direct contact DC and the contact plug 150.

The IC device 100 may include first insulating spacers 142S and second insulating spacers 144, which may sequentially cover both (i.e., opposing) sidewalls of the plurality of bit lines BL. The first insulating spacers 142S and the second insulating spacers 144 may be interposed between the contact plug 150 and the bit line BL on the boron-containing insulating filling pattern 140P. The first insulating spacers 142S and the second insulating spacers 144 may include different respective materials. The first insulating spacers 142S and the second insulating spacers 144 may not include boron (i.e., may be free of boron). In some embodiments, the first insulating spacers 142S may include a silicon oxide film, and the second insulating spacers 144 may include a silicon nitride film.

The first insulating spacer 142S may extend parallel to the bit line BL between the bit line BL and the plurality of contact plugs 150, which are arranged linearly in the Y direction, and the second insulating spacer 144 may extend parallel to the bit line BL between the bit line BL and the plurality of insulating fences 148, which may be arranged linearly in the Y direction. Each of the plurality of contact plugs 150 arranged linearly in the Y direction may be spaced apart from the bit line BL with the first insulating spacer 142S and the second insulating spacer 144 therebetween. Also, each of the insulating fences 148 arranged linearly in the Y direction may be spaced apart from the bit line BL with the first insulating spacer 142S and the second insulating spacer 144 therebetween. The second insulating spacer 144 may include a portion having a U sectional shape to cover both (i.e., opposing) sidewalls and a bottom surface of each of the plurality of insulating fences 148.

A metal silicide film 172 and a plurality of conductive landing pads LP may be sequentially formed on each of the plurality of contact plugs 150. The plurality of conductive landing pads LP may be connected to the plurality of contact plugs 150 through the metal silicide film 172. The plurality of conductive landing pads LP may extend from spaces between a plurality of insulating capping patterns 136 to tops of the plurality of insulating capping patterns 136 and vertically overlap portions of the plurality of bit lines BL, respectively. Each of the plurality of conductive landing pads LP may include a conductive barrier film 174 and a conductive layer 176.

In some embodiments, the metal silicide film 172 may include cobalt silicide, nickel silicide, or manganese silicide, but is not limited thereto. In some embodiments, the metal silicide film 172 may be omitted. The conductive barrier film 174 may have a Ti/TiN stack structure. The conductive layer 176 may include doped polysilicon, a metal, a metal silicide, a conductive metal nitride, or a combination thereof. The conductive layer 176 may include a metal, a metal nitride, a conductive polysilicon, or a combination thereof. For example, the conductive layer 176 may include tungsten (W). When viewed from above, the plurality of conductive landing pads LP may have a plurality of island-type pattern shapes. The plurality of conductive landing pads LP may be electrically insulated from each other by an insulating film 180 filling spaces around the plurality of conductive landing pads LP.

Figure 3A:
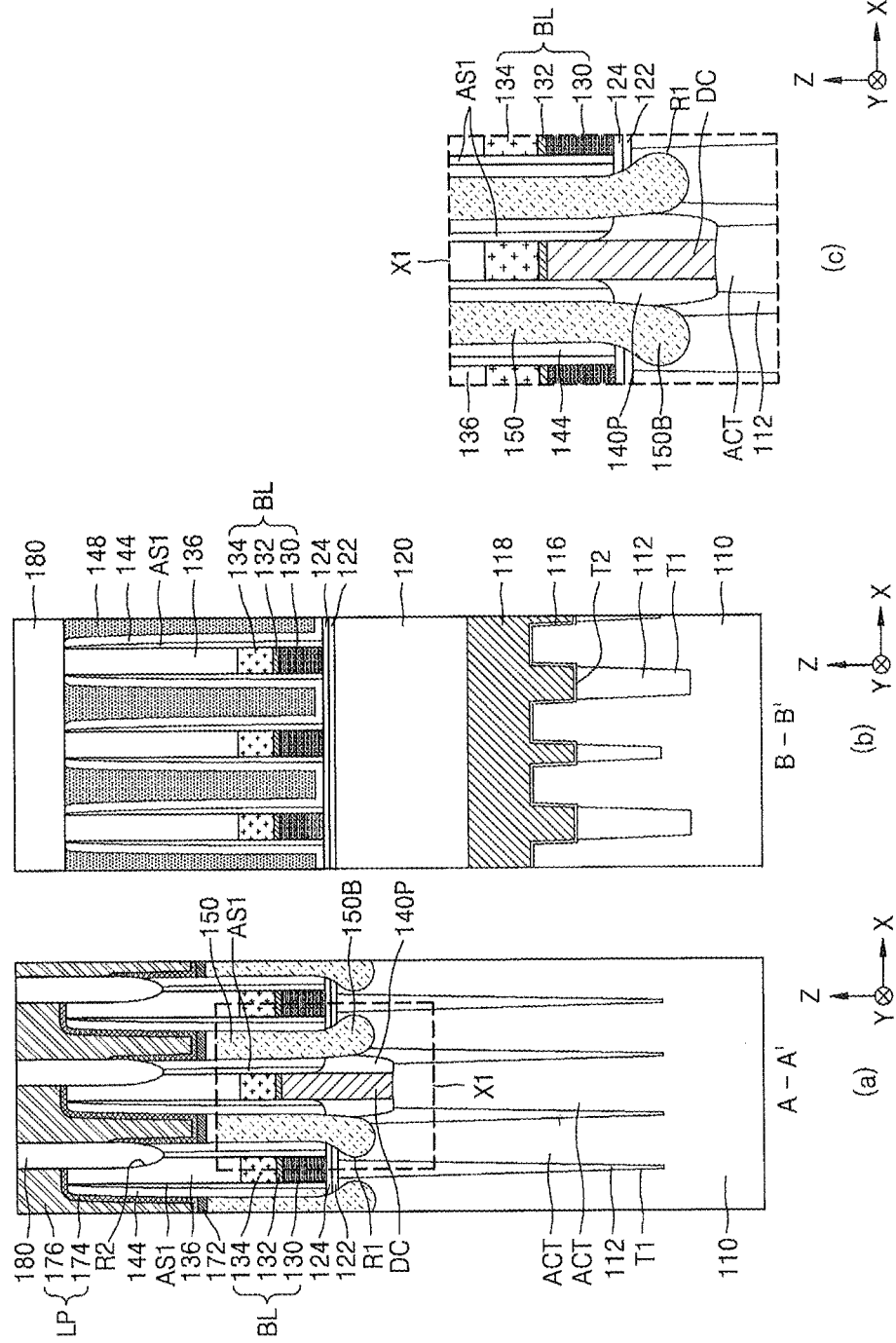
FIG. 3A shows cross-sectional views of an IC device according to embodiments.
Figure 3B:
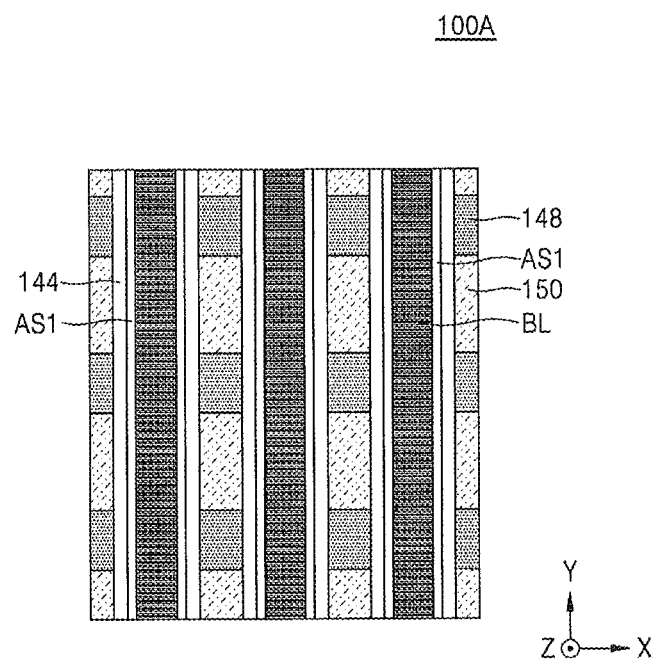
FIG. 3B is an enlarged plan view of a partial region of FIG. 3A.

FIG. 3A shows cross-sectional views of an IC device 100A according to embodiments, and FIG. 3B is an enlarged plan view of a partial region of FIG. 3A. In FIGS. 3A and 3B, the same reference numerals are used to denote the same elements as in FIGS. 2A and 2B, and a repeated detailed description thereof will be omitted.

Referring to FIGS. 3A and 3B, the IC device 100A may have substantially the same configuration as the IC device 100 shown in FIGS. 2A and 2B. However, the IC device 100A may include an air spacer AS1 instead of the first insulating spacer 142S. As used herein, a term "air" may refer to other gases that may be present in the atmosphere or in a manufacturing process. The air spacer AS1 may include a portion having a bottom defined by a boron-containing insulating filling pattern 140P and a portion having a bottom defined by a second insulating film 124.

Figure 4A:
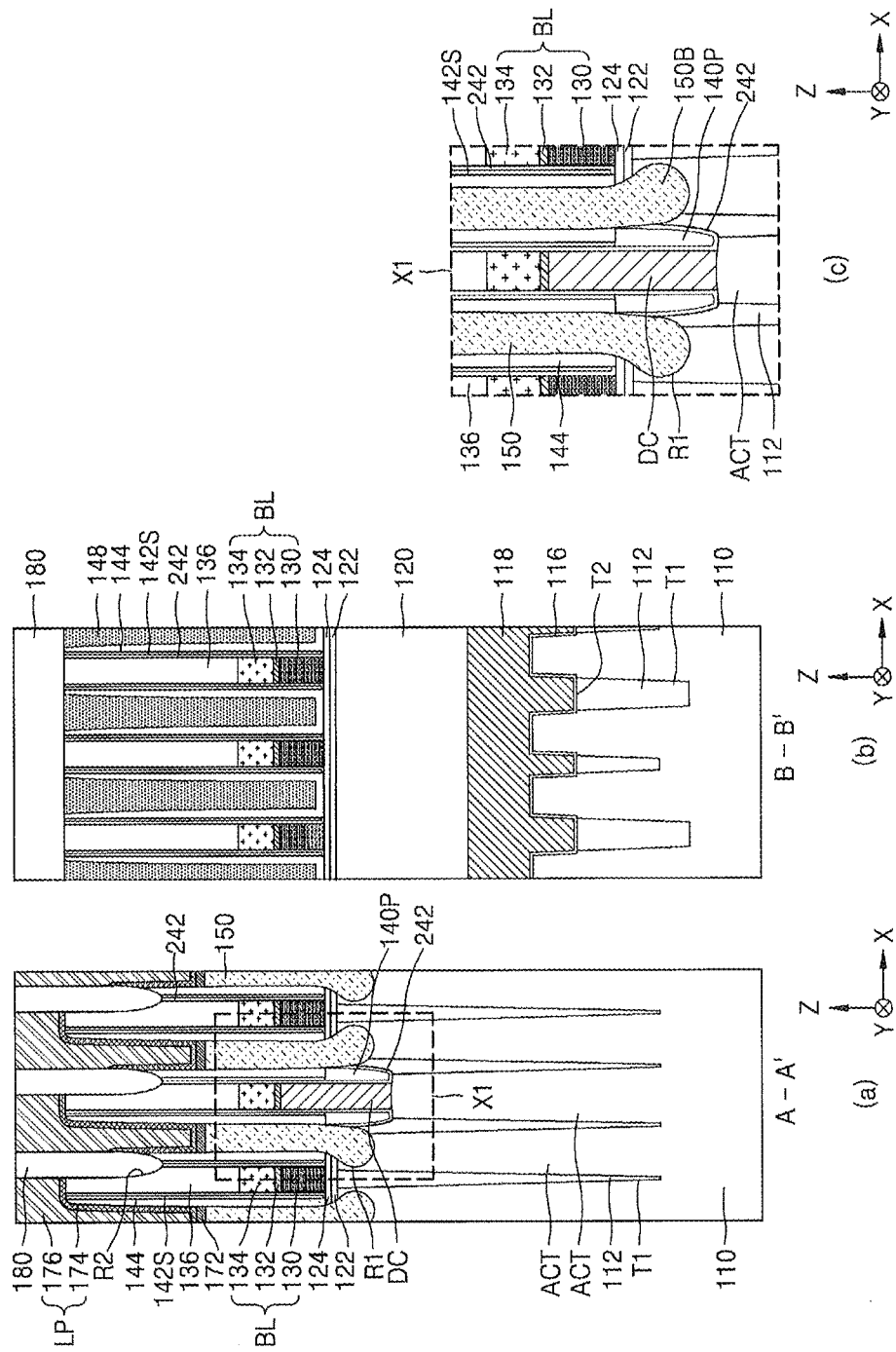
FIG. 4A shows cross-sectional views of an IC device according to embodiments.
Figure 4B:
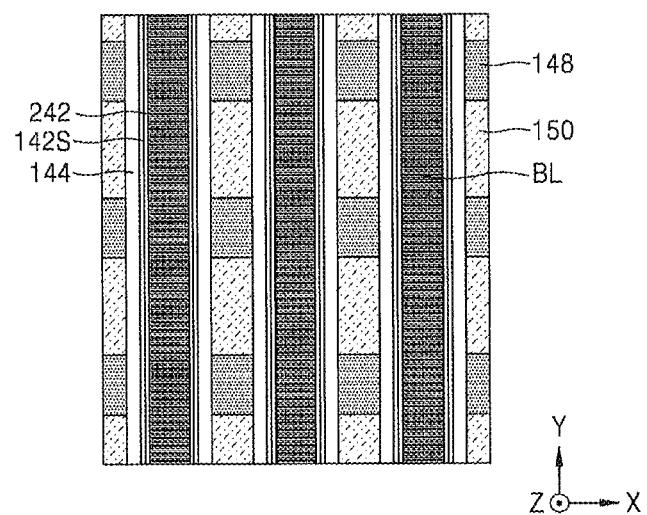
FIG. 4B is an enlarged plan view of a partial region of FIG. 4A.

FIG. 4A shows cross-sectional views of an IC device 200 according to embodiments, and FIG. 4B is an enlarged plan view of a partial region of FIG. 4A. In FIGS. 4A and 4B, the same reference numerals are used to denote the same elements as in FIGS. 2A and 2B, and a repeated detailed description thereof will be omitted.

Referring to FIGS. 4A and 4B, the IC device 200 may have substantially the same configuration as the IC device 100 shown in FIGS. 2A and 2B. However, the IC device 200 may include an inside insulating film 242 surrounding a portion of a boron-containing insulating filling pattern 140P.

The inside insulating film 242 may conformally cover sidewalls of each of a direct contact DC, a plurality of bit lines BL, and a plurality of insulating capping patterns 136 and a bottom surface and sidewalls of the boron-containing insulating filling pattern 140P. The inside insulating film 242 may be interposed between the bit lines BL and first insulating spacers 142S. The inside insulating film 242, the first insulating spacer 142S, and the second insulating spacer 144, which may be sequentially located on the sidewalls of the bit line BL, may be interposed between the bit line BL and the contact plug 150 and between the bit line BL and an insulating fence 148.

The boron-containing insulating filling pattern 140P may be spaced apart from the direct contact DC and the contact plug 150 with the inside insulating film 242 therebetween. A portion of the inside insulating film 242, which surrounds the boron-containing insulating filling pattern 140P, may constitute a gap insulating film/region. The gap insulating film/region, which is the portion of the inside insulating film 242, may be interposed between bottom portions 150B of the plurality of contact plugs 150 and the boron-containing insulating filling pattern 140P and between the direct contact DC and the boron-containing insulating filling pattern 140P. The gap insulating film/region may have a lower dielectric constant than a dielectric constant of the boron-containing insulating pattern 140P.

The inside insulating film 242 and the boron-containing insulating filling pattern 140P may include materials having different etch selectivities. In some embodiments, the inside insulating film 242 may include a silicon oxide film.

In the IC device 200, the boron-containing insulating filling pattern 140P having a relatively low dielectric constant and the inside insulating film 242 may be interposed between the direct contact DC and the bottom portion 150B of the contact plug 150, which may be adjacent to each other. Thus, an undesired parasitic capacitance may be reduced between the direct contact DC and the contact plug 150.

Figure 5A:
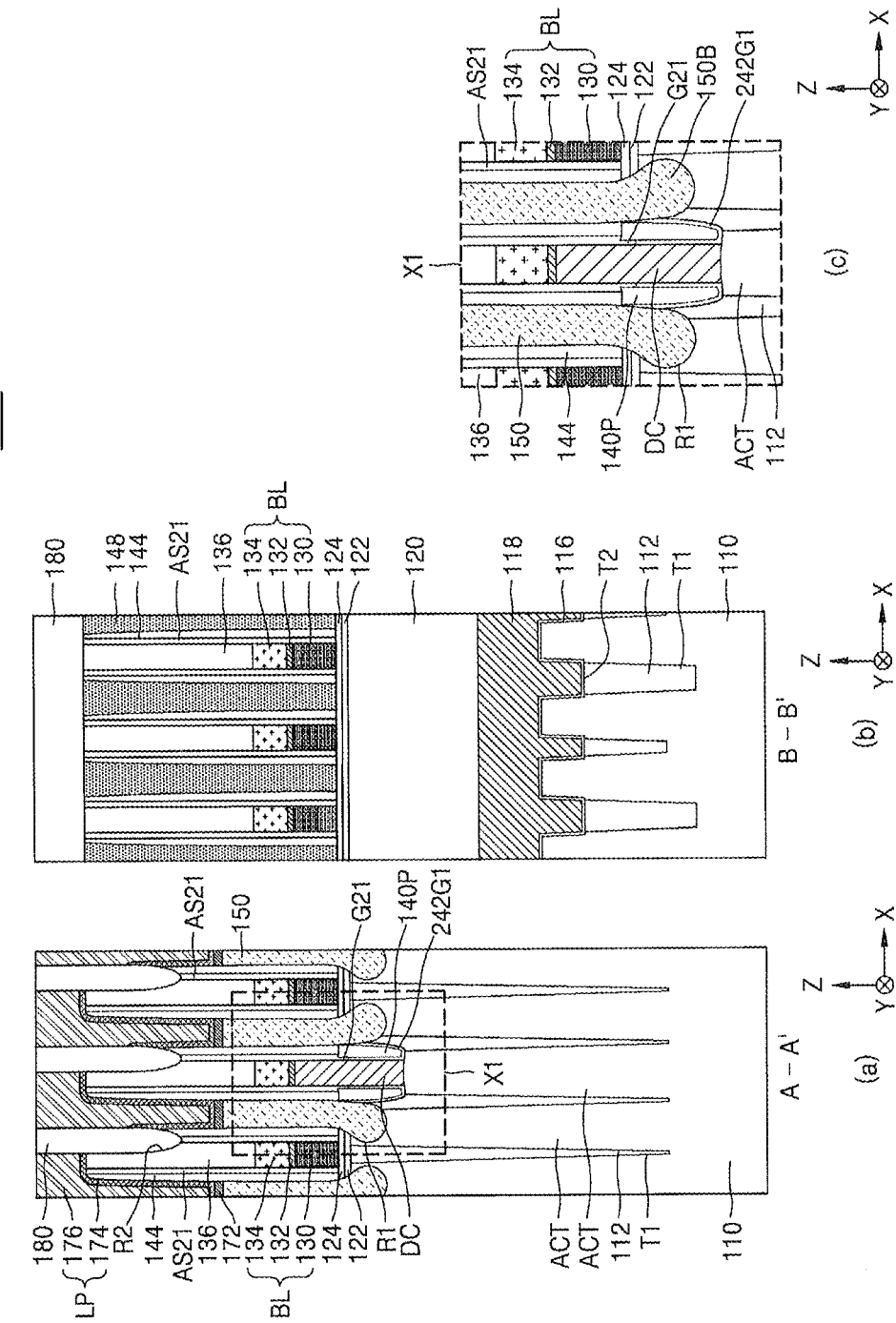
FIG. 5A shows cross-sectional views of an IC device according to embodiments.
Figure 5B:
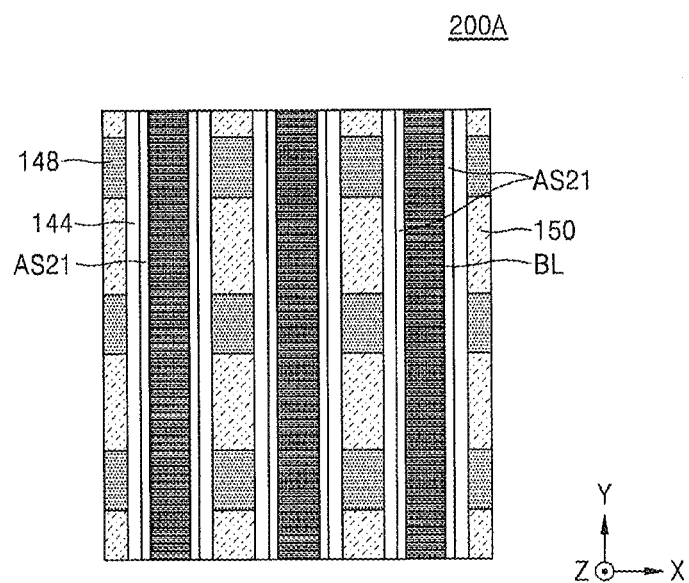
FIG. 5B is an enlarged plan view of a partial region of FIG. 5A.

FIG. 5A shows cross-sectional views of an IC device 200A according to embodiments, and FIG. 5B is an enlarged plan view of a partial region of FIG. 5A. In FIGS. 5A and 5B, the same reference numerals are used to denote the same elements as in FIGS. 4A and 4B, and a repeated detailed description thereof will be omitted.

Referring to FIGS. 5A and 5B, the IC device 200A may have substantially the same configuration as the IC device 200 shown in FIGS. 4A and 4B. However, the IC device 200A may include an air spacer AS21, which may be disposed between a bit line BL and a second insulating spacer 144, and an inside insulating film 242G1, which may surround a portion of a boron-containing insulating filling pattern 140P at a lower level than the air spacer AS21.

The inside insulating film 242G1 and the boron-containing insulating filling pattern 140P may include materials having different etch selectivities. In some embodiments, the inside insulating film 242G1 may include a silicon oxide film.

The air spacer AS21 may include a portion having a bottom defined by the boron-containing insulating filling pattern 140P and the inside insulating film 242G1 and a portion having a bottom defined by a second insulating film 124. The air spacer AS21 may include a gap air (i.e., air gap) portion G21, which may extend toward a substrate 110 between a direct contact DC and the boron-containing insulating filling pattern 140P.

In the IC device 200A, the inside insulating film 242G1 and the gap air portion G21 may constitute a gap insulating film/region. In the IC device 200A, the boron-containing insulating filling pattern 140P having a relatively low dielectric constant, the gap air portion G21 of the air spacer AS21, and the inside insulating film 242G1 may be interposed between the direct contact DC and a bottom portion 150B of a contact plug 150, which may be adjacent to each other. An undesired parasitic capacitance may be reduced between the direct contact DC and the contact plug 150.

Figure 6:
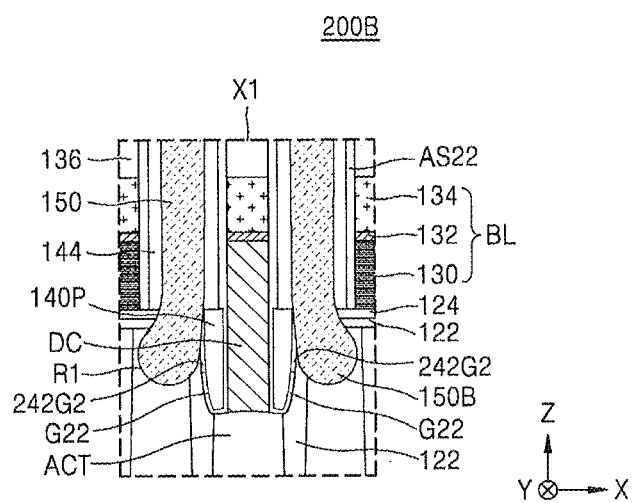
FIG. 6 is a cross-sectional view of an IC device according to embodiments.

FIG. 6 is a cross-sectional view of an IC device 200B according to embodiments. FIG. 6 is an enlarged cross-sectional view of other components of a portion corresponding to a dashed region indicated by "X1" in (a) of FIG. 5A. In FIG. 6, the same reference numerals are used to denote the same elements as in FIGS. 5A and 5B, and a repeated detailed description thereof will be omitted.

Referring to FIG. 6, the IC device 200B may have substantially the same configuration as the IC device 200 shown in FIGS. 4A and 4B. However, the IC device 200B may include an air spacer AS22 disposed between a bit line BL and a second insulating spacer 144 and an inside insulating film 242G2 interposed between a boron-containing insulating filling pattern 140P and a bottom portion 150B of a contact plug 150.

The inside insulating film 242G2 and the boron-containing insulating filling pattern 140P may include materials having different etch selectivities. In some embodiments, the inside insulating film 242G2 may include a silicon oxide film.

The air spacer AS22 may extend into a substrate 110 from a space between the bit line BL and the second insulating spacer 144. The air spacer AS22 may include a gap air portion G22, which may extend between a direct contact DC and the boron-containing insulating filling pattern 140P and between the boron-containing insulating filling pattern 140P and the bottom portion 150B of the contact plug 150 and surround the boron-containing insulating filling pattern 140P. The gap air portion G22 of the air spacer AS22 may surround a sidewall and a bottom surface of the boron-containing insulating filling pattern 140P. The air spacer AS22 may include a portion having a bottom defined by a second insulating film 124. In the IC device 200B, the inside insulating film 242G2 and the gap air portion G22 may constitute a gap insulating film/region.

In the IC device 200B, the boron-containing insulating filling pattern 140P having a relatively low dielectric constant, the gap air portion G22 of the air spacer AS22, and the inside insulating film 242G2, may be interposed between the direct contact DC and the bottom portion 150B of the contact plug 150, which may be adjacent to each other. Thus, an undesired parasitic capacitance may be reduced between the direct contact DC and the contact plug 150.

Figure 7A:
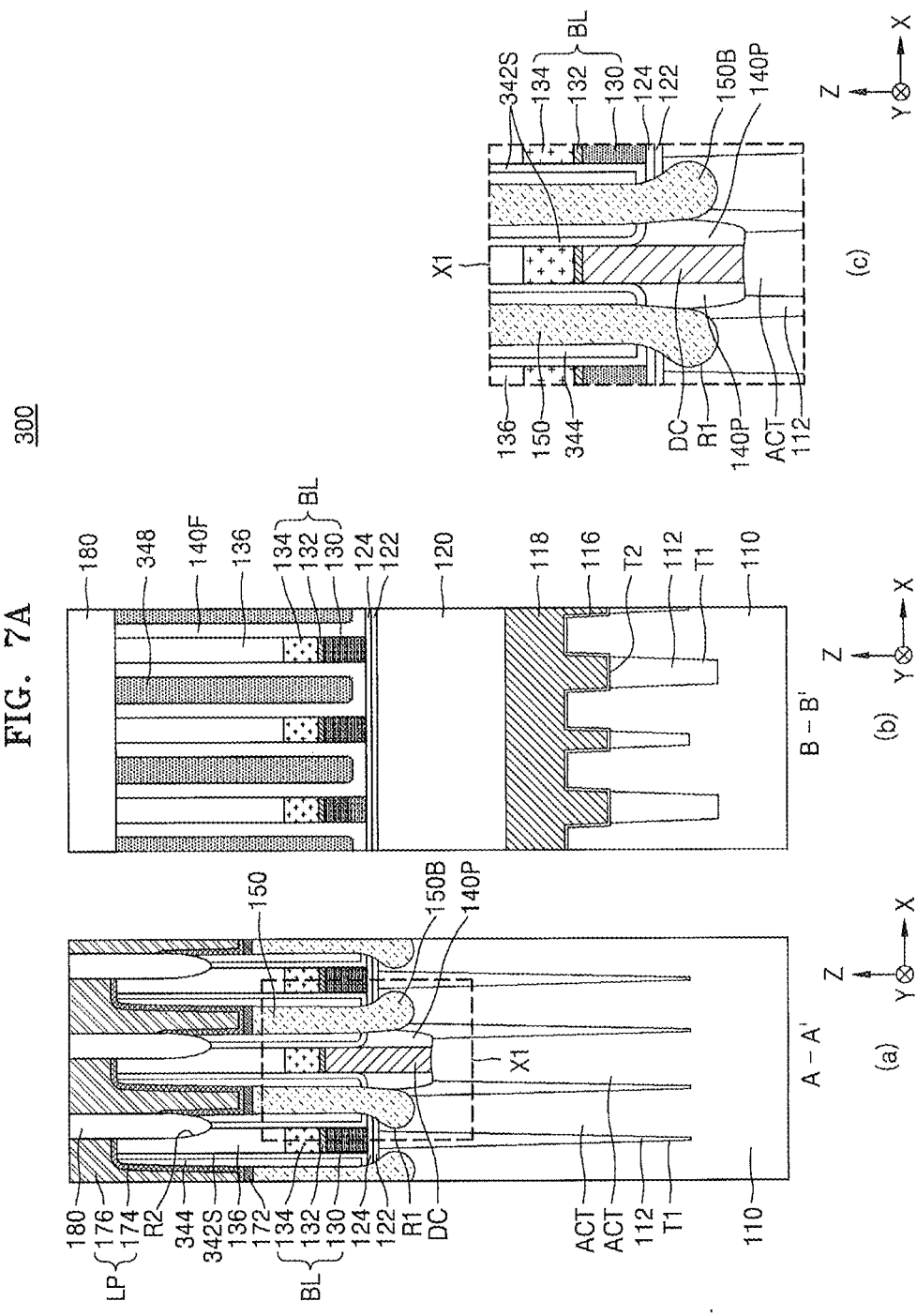
FIG. 7A shows cross-sectional views of an IC device according to embodiments.
Figure 7B:
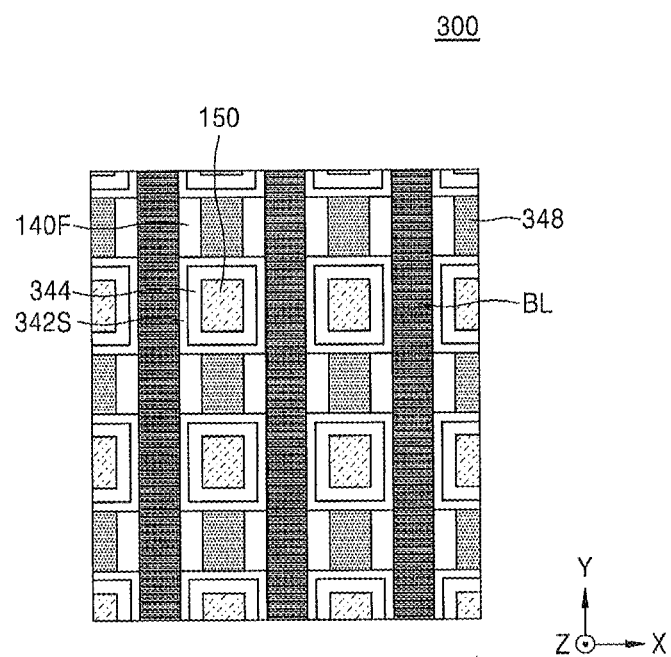
FIG. 7B is an enlarged plan view of a partial region of FIG. 7A.

FIG. 7A shows cross-sectional views of an IC device 300 according to embodiments, and FIG. 7B is an enlarged plan view of a partial region of FIG. 7A. In FIGS. 7A and 7B, the same reference numerals are used to denote the same elements as in FIGS. 2A and 2B, and a repeated detailed description thereof will be omitted.

Referring to FIGS. 7A and 7B, the IC device 300 may have substantially the same configuration as the IC device 100 shown in FIGS. 2A and 2B. However, the IC device 300 may include a plurality of first insulating spacers 342S and a plurality of second insulating spacers 344, which may cover both (i.e., opposing) sidewalls of a plurality of bit lines BL.

As shown in FIG. 7B, the plurality of first insulating spacers 342S and the plurality of second insulating spacers 344, each of which may have a ring (e.g., circular or rectangular) shape, may surround perimeters of contact plugs 150, respectively. Each of the plurality of first insulating spacers 342S and the plurality of second insulating spacers 344 may include a portion interposed between a sidewall of the contact plug 150 and the bit line BL on a boron-containing insulating filling pattern 140P and a portion configured to extend between the contact plug 150 and an insulating fence 348. The first insulating spacer 342S and the second insulating spacer 344 may not be interposed between the bit line BL and the insulating fence 348.

Between the bit line BL and the contact plug 150, the first insulating spacer 342S may have an L sectional shape, and the second insulating spacer 344 may be spaced apart from a second insulating film 124 with the first insulating spacer 342S therebetween.

Between a direct contact DC and the contact plug 150, the second insulating spacer 344 may be spaced apart from the boron-containing insulating filling pattern 140P with the first insulating spacer 342S therebetween.

In addition, the IC device 300 may further include a plurality of boron-containing insulating fences 140F, which may be interposed between the bit line BL and a plurality of insulating fences 348 arranged linearly in a Y direction. The plurality of boron-containing insulating fences 140F may include the same material as the boron-containing insulating filling pattern 140P. Each of the plurality of boron-containing insulating fences 140F may have a U sectional shape to be on (e.g., to cover) both (i.e., opposing) sidewalls and a bottom surface of an insulating fence 148.

In some embodiments, each of a boron content and a nitrogen content in the boron-containing insulating fence 140F may be variable in a thickness direction of the boron-containing insulating fence 140F. For example, the boron content in the boron-containing insulating fence 140F may increase toward the bit line BL, and may be reduced toward the insulating fence 348. Also, the nitrogen content in the boron-containing insulating fence 140F may be reduced toward the bit line BL and may increase toward the insulating fence 348.

Detailed configurations of the first insulating spacer 342S, the second insulating spacer 344, and the insulating fence 348 may be substantially the same as the first insulating spacer 142S, the second insulating spacer 144, and insulating fence 148 described with reference to FIGS. 2A and 2B.

Figure 8A:
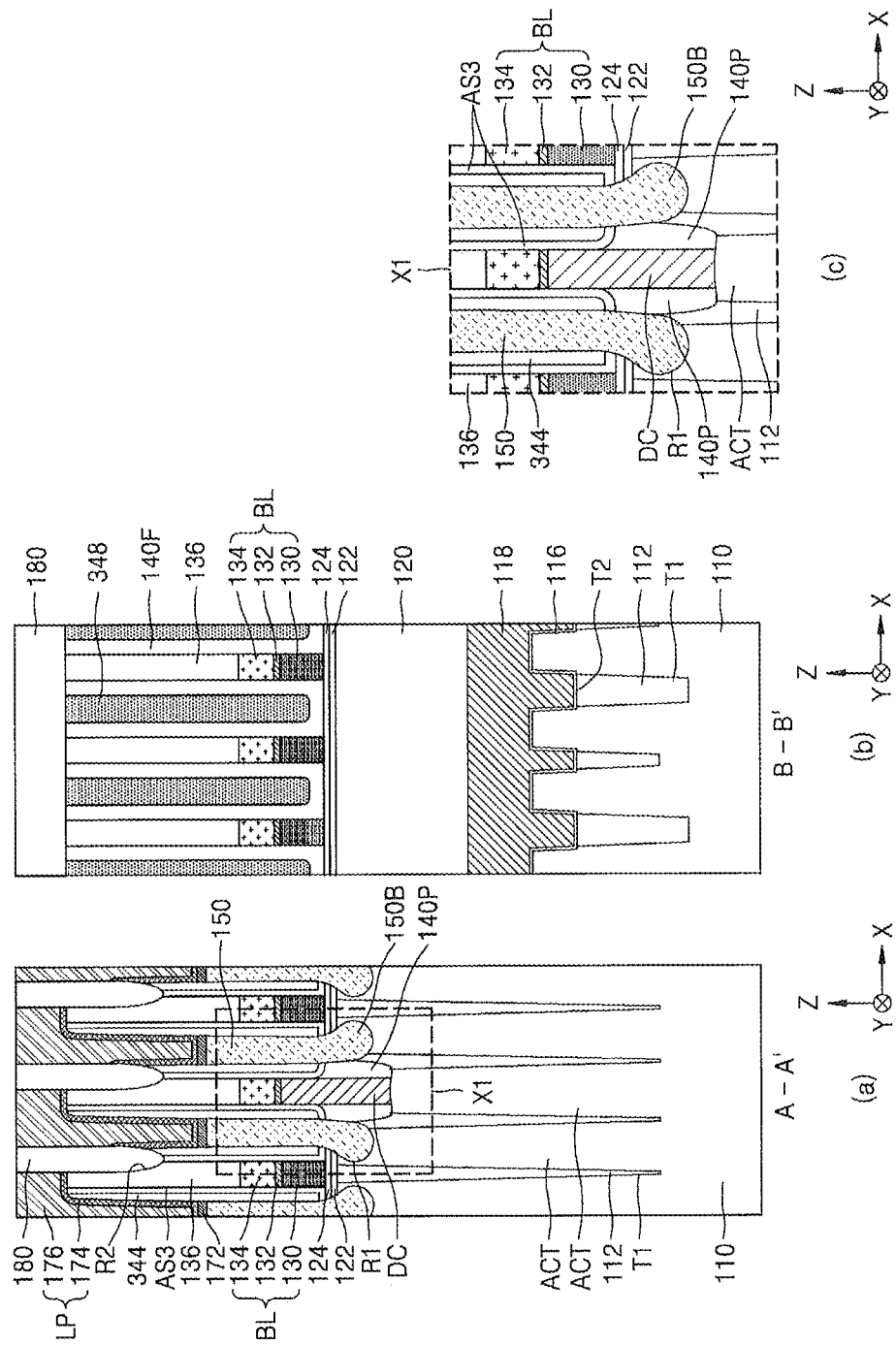
FIG. 8A shows cross-sectional views of an IC device according to embodiments.
Figure 8B:
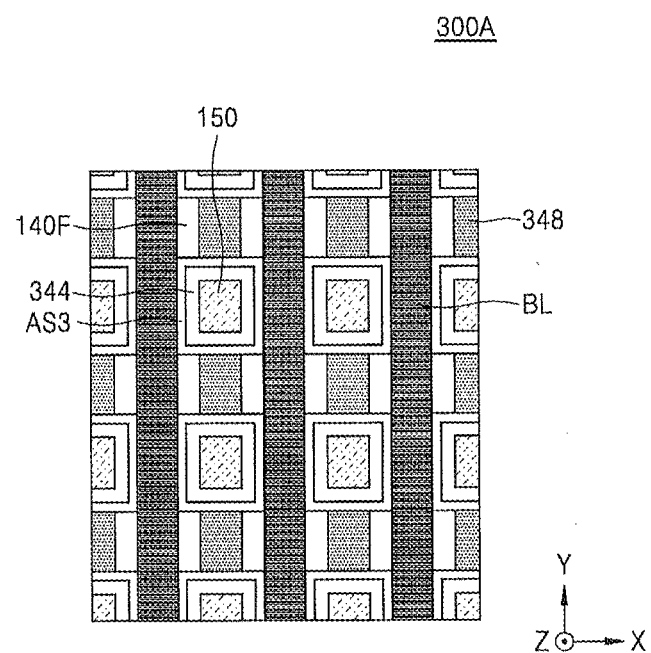
FIG. 8B is an enlarged plan view of a partial region of FIG. 8A.

FIG. 8A shows cross-sectional views of an IC device 300A according to embodiments, and FIG. 8B is an enlarged plan view of a partial region of FIG. 8A. In FIGS. 8A and 8B, the same reference numerals are used to denote the same elements as in FIGS. 7A and 7B, and a repeated detailed description thereof will be omitted.

Referring to FIGS. 8A and 8B, the IC device 300A may have substantially the same configuration as the IC device 300 shown in FIGS. 7A and 7B. However, the IC device 300A may include an air spacer AS3 instead of the first insulating spacer 342S. The air spacer AS3 may have a ring shape and surround a contact plug 150.

The air spacer AS3 may include a portion having a bottom defined by a boron-containing insulating filling pattern 140P, and a portion having a bottom defined by a second insulating film 124. Between the bit line BL and the contact plug 150, the second insulating spacer 344 may be spaced apart from the second insulating film 124 with the air spacer AS3 therebetween. Between a direct contact DC and the contact plug 150, the second insulating spacer 344 may be spaced apart from the boron-containing insulating filling pattern 140P with the air spacer AS3.

Figure 9A:
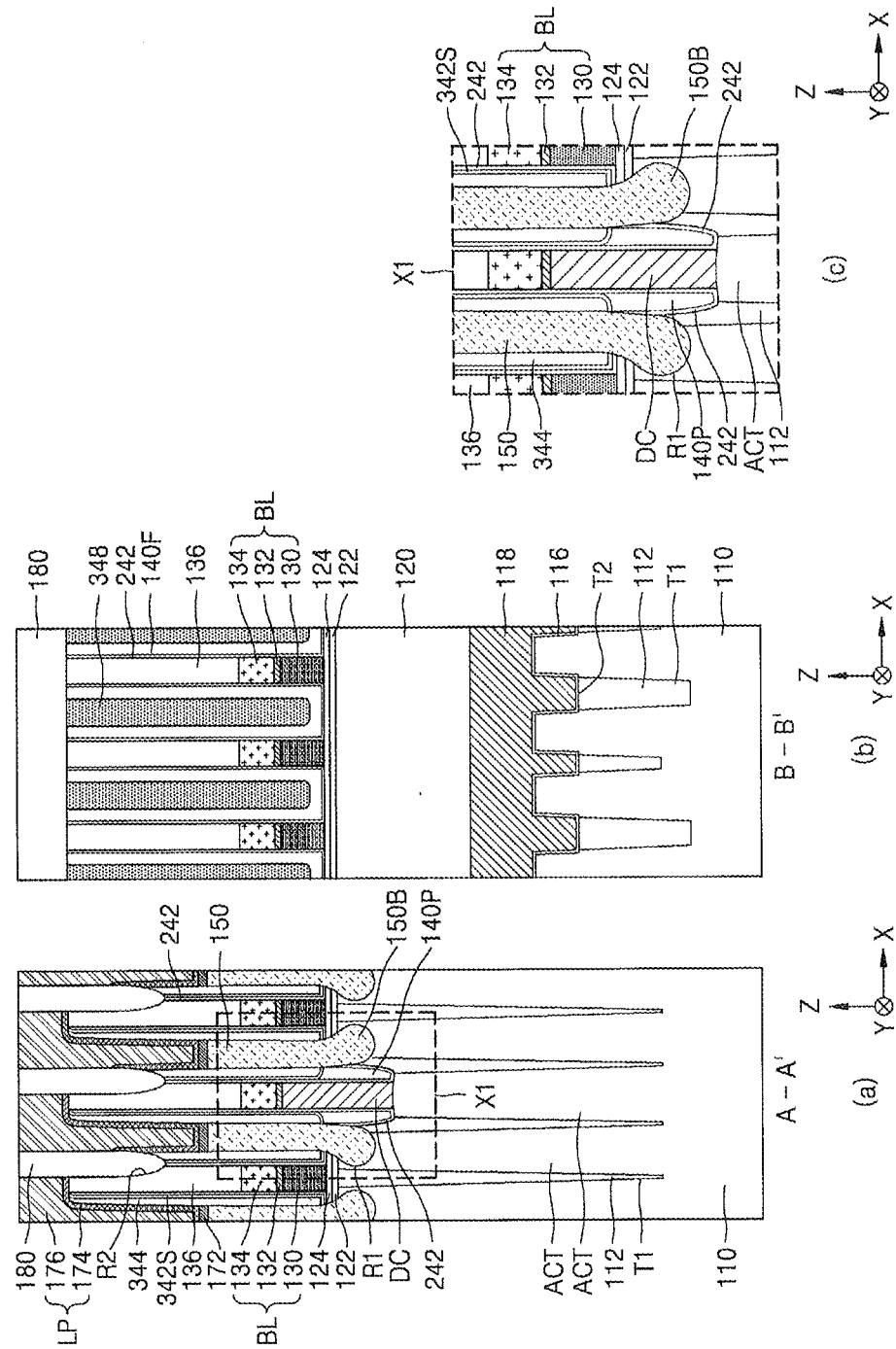
FIG. 9A shows cross-sectional views of an IC device according to embodiments.
Figure 9B:
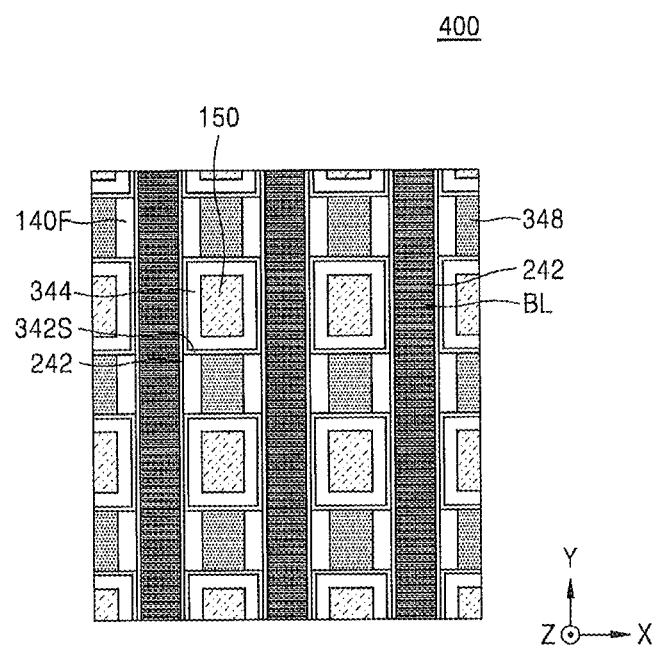
FIG. 9B is an enlarged plan view of a partial region of FIG. 9A.

FIG. 9A shows cross-sectional views of an IC device 400 according to embodiments, and FIG. 9B is an enlarged plan view of a partial region of FIG. 9A. In FIGS. 9A and 9B, the same reference numerals are used to denote the same elements as in FIGS. 2A to 7B, and a repeated detailed description thereof will be omitted.

Referring to FIGS. 9A and 9B, the IC device 400 may have substantially the same configuration as the IC device 300 shown in FIGS. 7A and 7B. However, the IC device 400 may include an inside insulating film 242 configured to surround a portion of a boron-containing insulating filling pattern 140P. A detailed configuration of the inside insulating film 242 may be substantially the same as that described with reference to FIGS. 4A and 4B. However, the inside insulating film 242 may be in contact with a boron-containing insulating fence 140F between a bit line BL and an insulating fence 348. The inside insulating film 242 may be spaced apart from the insulating fence 348 with the boron-containing insulating fence 140F therebetween. The inside insulating fence 140F may have a U sectional shape to cover both (i.e., opposing) sidewalls and a bottom surface of an insulating fence 148.

The inside insulating film 242 may be interposed between the bit line BL and a first insulating spacer 342S. Thus, the inside insulating film 242, the first insulating spacer 342S, and a second insulating spacer 344, which may be sequentially disposed on sidewalls of the bit line BL, may be interposed between the bit line BL and a contact plug 150. The inside insulating film 242 and the boron-containing insulating fence 140F, which may be sequentially disposed on the sidewalls of the bit line BL, may be interposed between the bit line BL and the insulating fence 148.

Figure 10A:
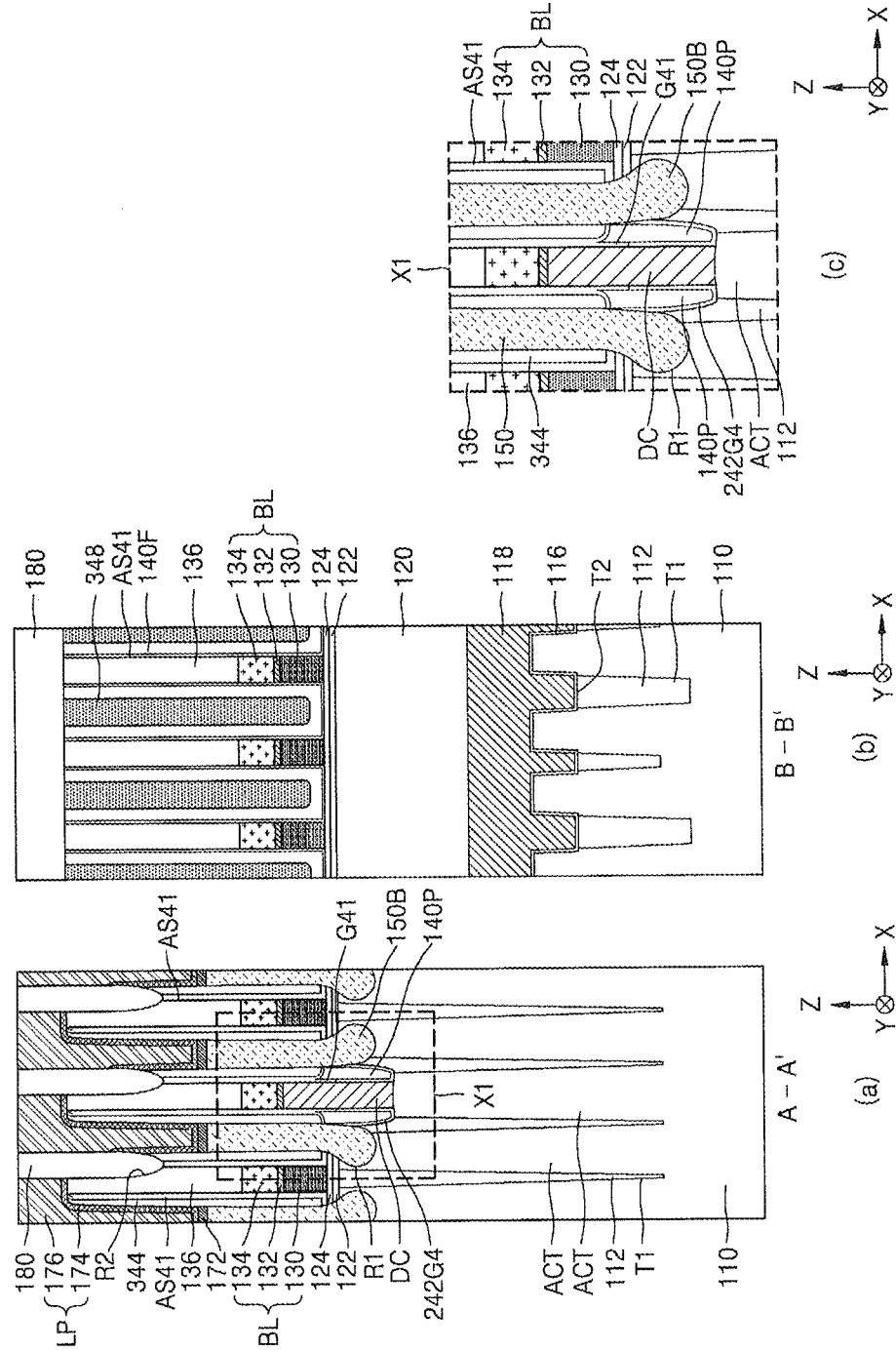
FIG. 10A shows cross-sectional views of an IC device according to embodiments.
Figure 10B:
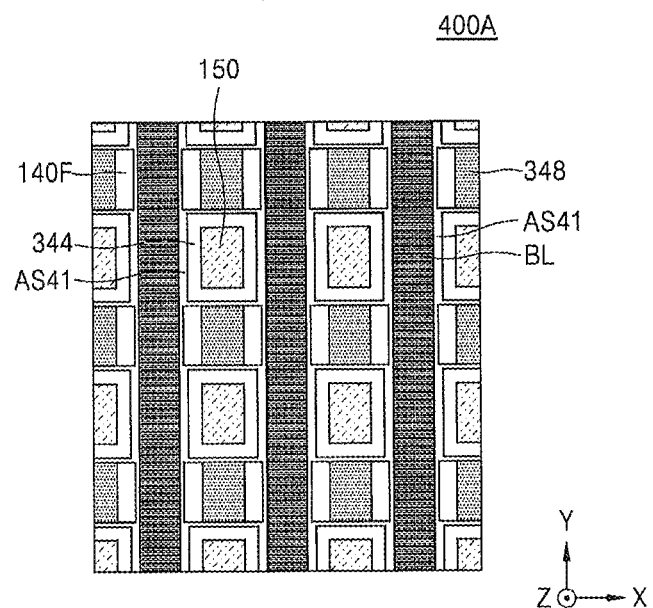
FIG. 10B is an enlarged plan view of a partial region of FIG. 10A.

FIG. 10A shows cross-sectional views of an IC device 400A according to embodiments, and FIG. 10B is an enlarged plan view of a partial region of FIG. 10A. In FIGS. 10A and 10B, the same reference numerals are used to denote the same elements as in FIGS. 9A and 9B, and a repeated detailed description thereof will be omitted.

Referring to FIGS. 10A and 10B, the IC device 400A may have substantially the same configuration as the IC device 400 shown in FIGS. 9A and 9B. However, the IC device 400A may include an air spacer AS41, which is disposed between a bit line BL and a second insulating spacer 344, and an inside insulating film 242G4, which may surround a portion of a boron-containing insulating filling pattern 140P at a lower level than the air spacer AS41.

A detailed configuration of the inside insulating film 242G4 may be substantially the same as that of the inside insulating film 242G1 described with reference to FIGS. 5A and 5B. The air spacer AS41 may include a portion having a bottom defined by the boron-containing insulating filling pattern 140P and the inside insulating film 242G4 and a portion having a bottom defined by a second insulating film 124. As shown in FIG. 10B, the air spacer AS41 may include a plurality of ring-shaped portions configured to surround a plurality of contact plugs 150 and a plurality of linear portions, which may communicate (i.e., be connected) with the plurality of ring-shaped portions and be interposed between the bit line BL and a boron-containing insulating fence 140F.

The air spacer AS41 may include a gap air portion G41, which may extend toward a substrate 110 between a direct contact DC and the boron-containing insulating filling pattern 140P. In the IC device 400A, the inside insulating film 242G4 and the gap air portion G41 may constitute a gap insulating film/region.

In the IC device 400A, a boron-containing insulating filling pattern 140P having a relatively low dielectric constant, the gap air portion G41 of the air spacer AS41, and the inside insulating film 242G4 may be interposed between the direct contact DC and a bottom portion 150B of the contact plug 150, which may be adjacent to each other. Thus, an undesired parasitic capacitance may be reduced between the direct contact DC and the contact plug 150.

Figure 11:
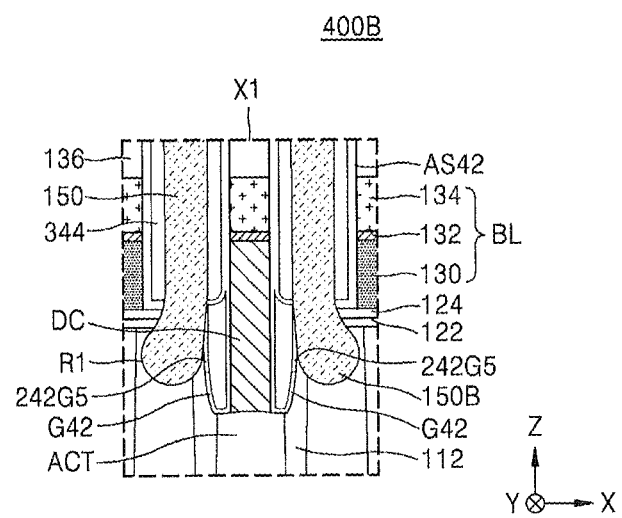
FIG. 11 is a cross-sectional view of an IC device according to embodiments.

FIG. 11 is a cross-sectional view of an IC device 400B according to embodiments. FIG. 11 is an enlarged cross-sectional view of other components of a portion corresponding to a dashed region indicated by "X1" in (a) of FIG. 10A. In FIG. 11, the same reference numerals are used to denote the same elements as in FIGS. 10A and 10B, and a repeated detailed description thereof will be omitted.

Referring to FIG. 11, the IC device 400B may have substantially the same configuration as the IC device 400 shown in FIGS. 9A and 9B. However, the IC device 400B may include an air spacer AS42 disposed between a bit line BL and a second insulating spacer 344 and an inside insulating film 242G5 interposed between a boron-containing insulating filling pattern 140P and a bottom portion 150B of a contact plug 150. In some embodiments, the inside insulating film 242G5 may include a silicon oxide film.

The air spacer AS42 may extend into a substrate 110 from a space between the bit line BL and the second insulating spacer 344. The air spacer AS42 may include a gap air portion G42, which may extend between a direct contact DC and the boron-containing insulating filling pattern 140P and between the boron-containing insulating filling pattern 140P and the bottom portion 150B of the contact plug 150 and may surround the boron-containing insulating filling pattern 140P. The gap air portion G42 of the air spacer AS42 may surround a sidewall and a bottom surface of the boron-containing insulating filling pattern 140P. The air spacer AS42 may include a portion having a bottom defined by the second insulating film 124. In the IC device 400B, the inside insulating film 242G5 and the gap air portion G42 may constitute a gap insulating film/region.

In the IC device 400B, the boron-containing insulating filling pattern 140P having a relatively low dielectric constant, the gap air portion G42 of the air spacer AS42, and the inside insulating film 242G5, may be interposed between the direct contact DC and the bottom portion 150B of the contact plug 150, which are adjacent to each other, thereby reducing an undesired parasitic capacitance between the direct contact DC and the contact plug 150.

Figure 12A:
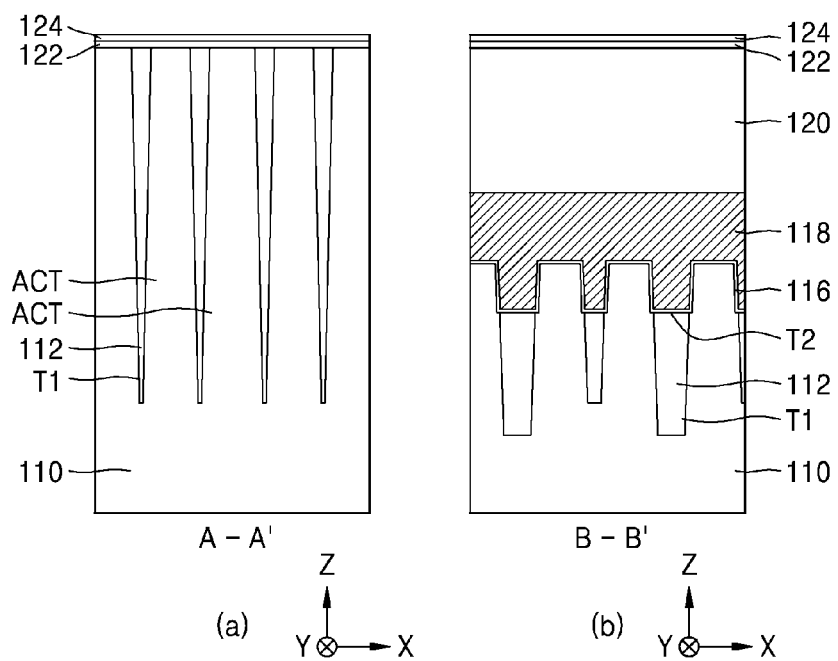
FIGS. 12A to 12N are diagrams of a process sequence of a method of manufacturing an IC device according to embodiments.
Figure 12B:
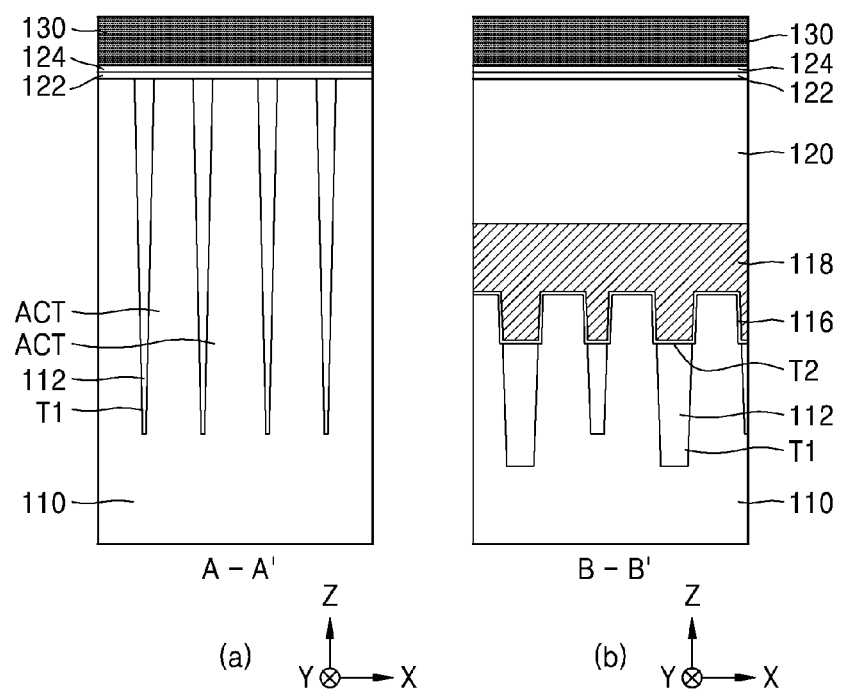
Figure 12C:
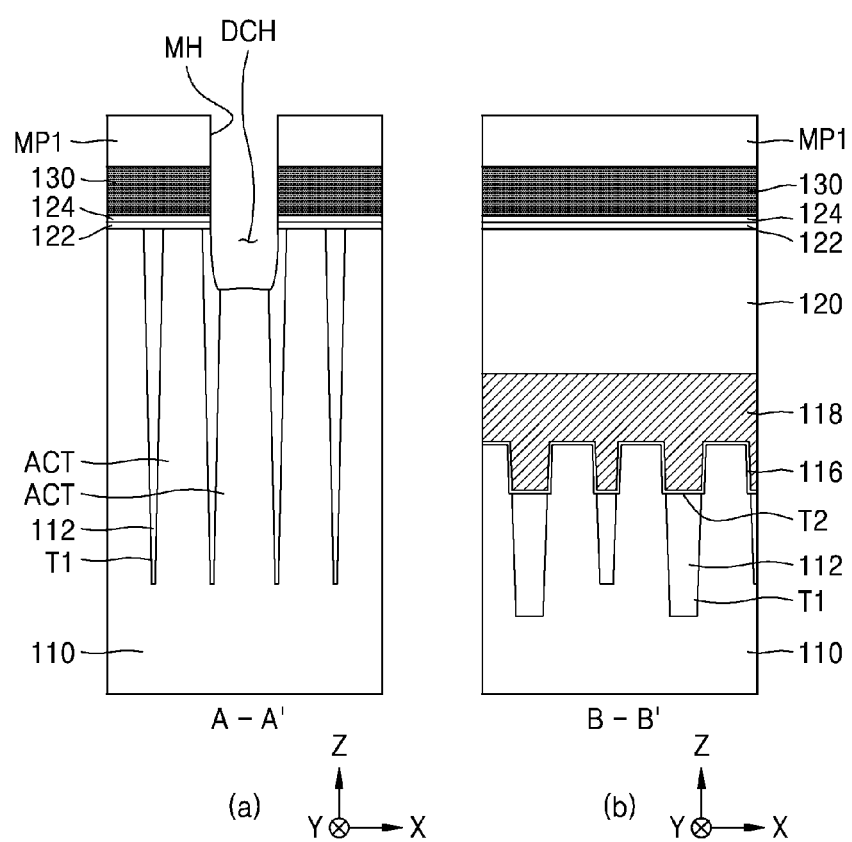
Figure 12D:
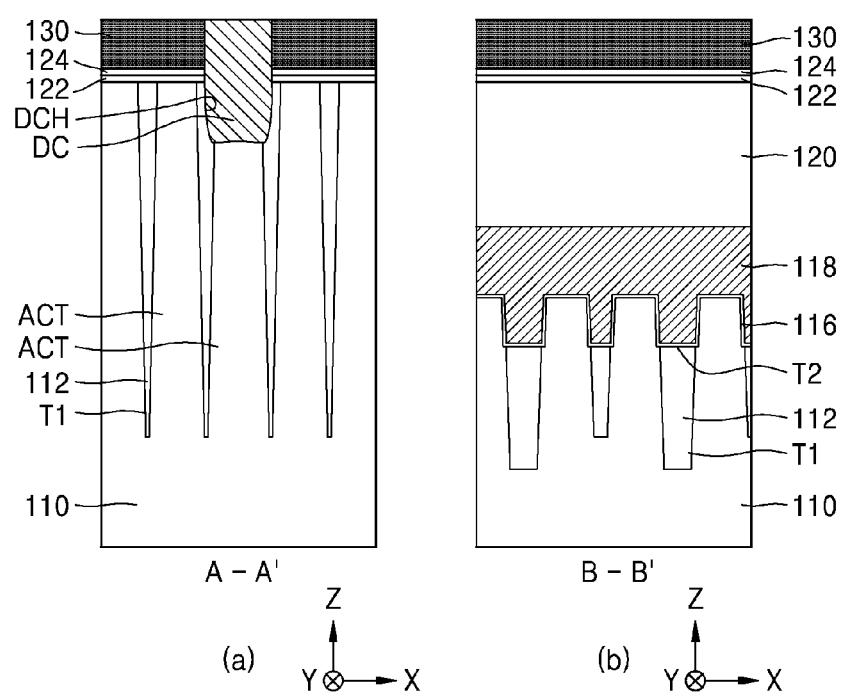
Figure 12E:
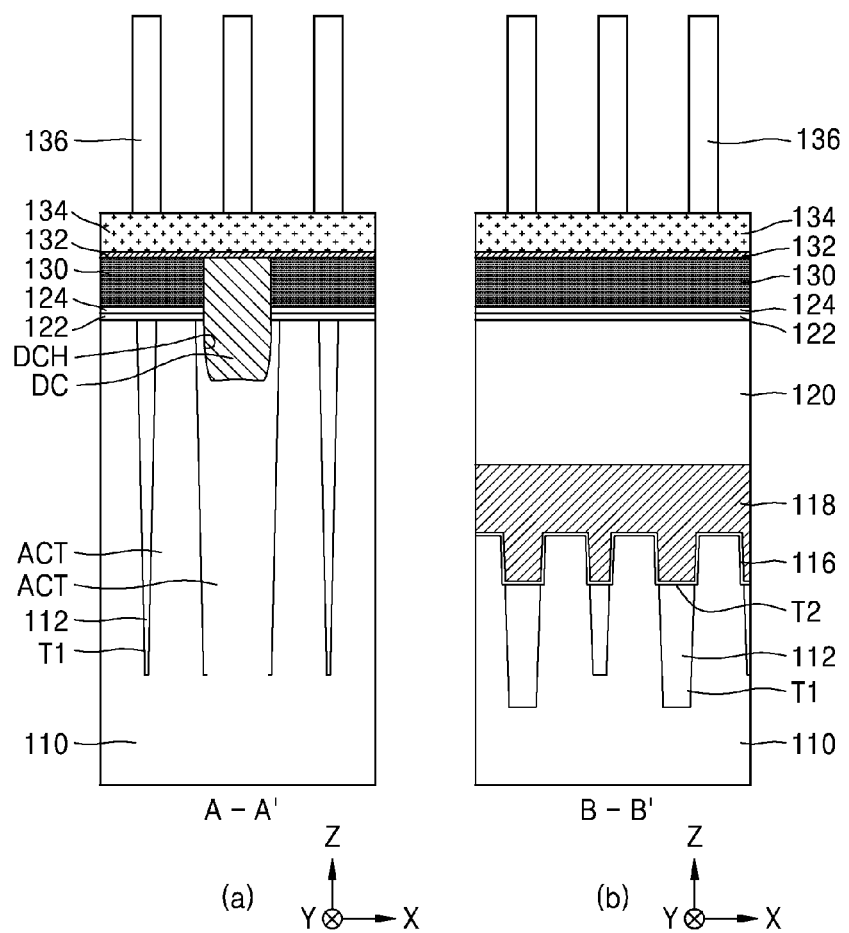
Figure 12F:
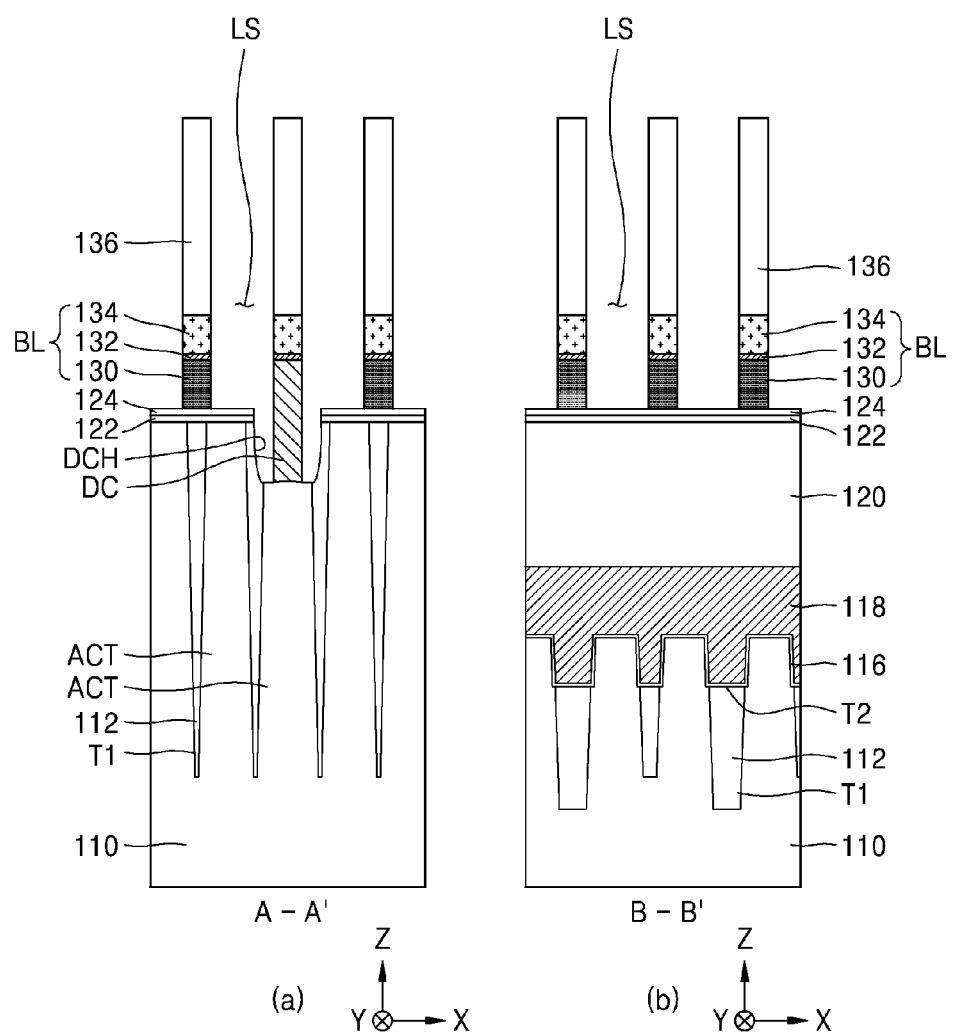
Figure 12H:
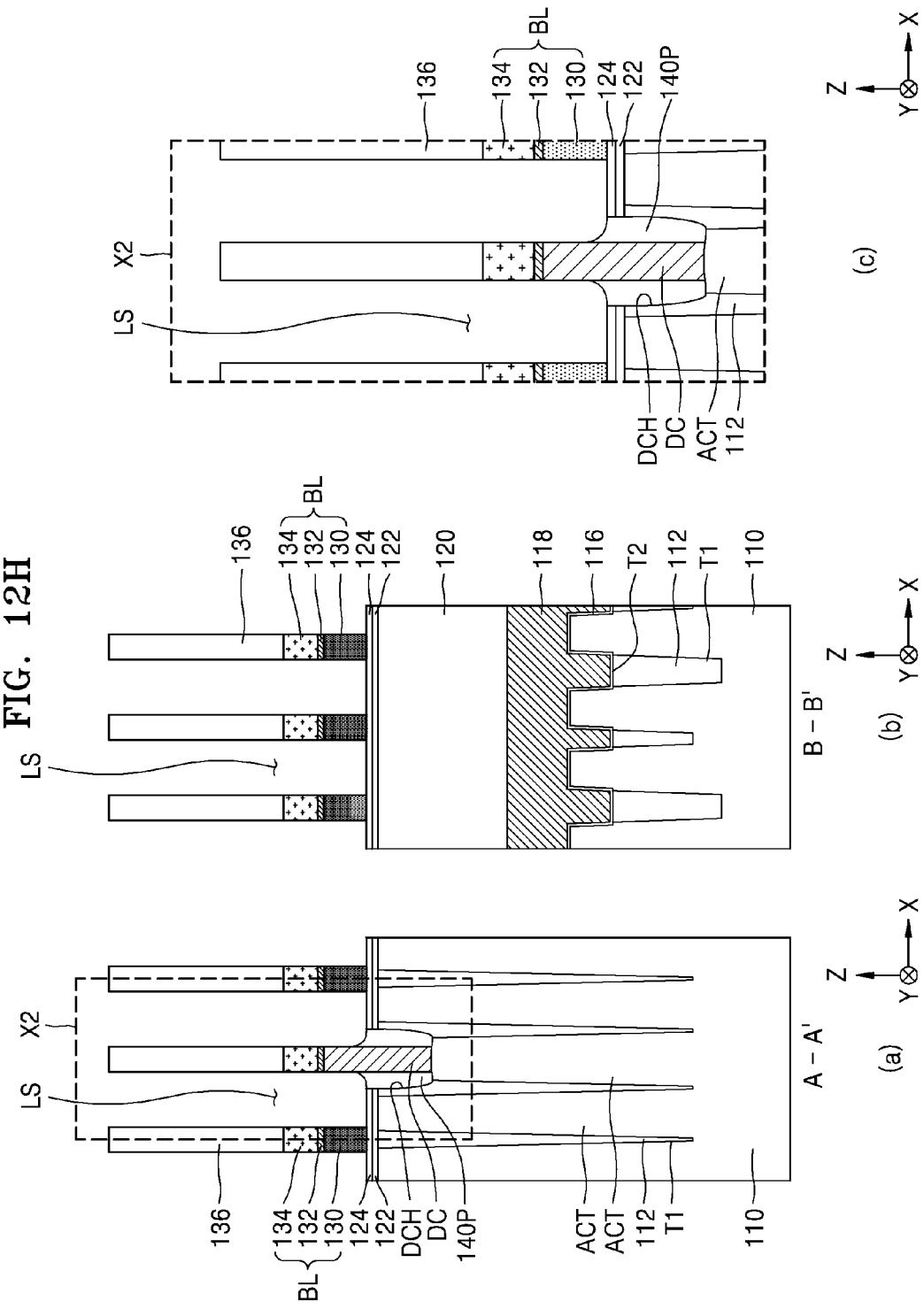
Figure 12I:
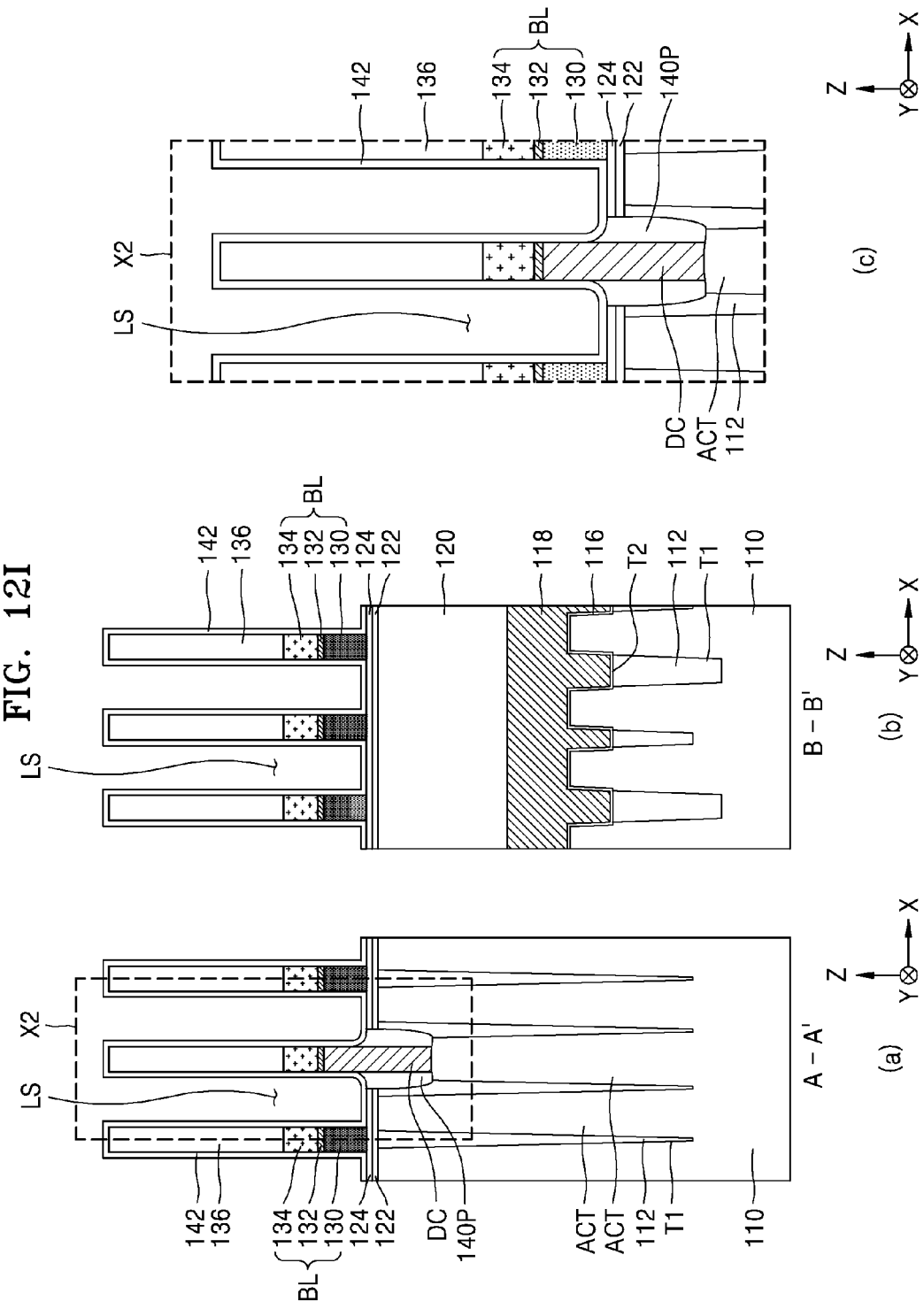
Figure 12M:
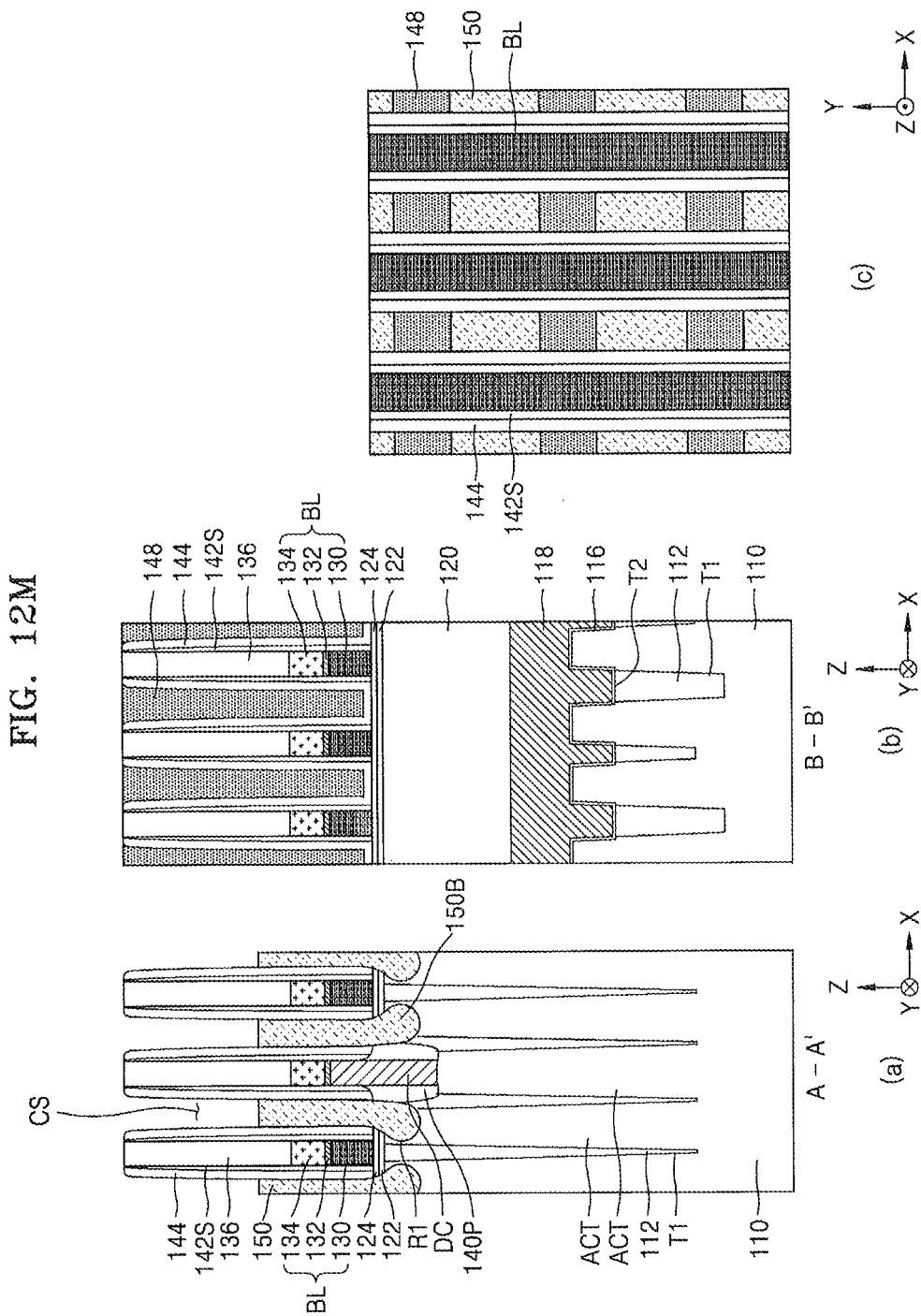
Figure 12N:
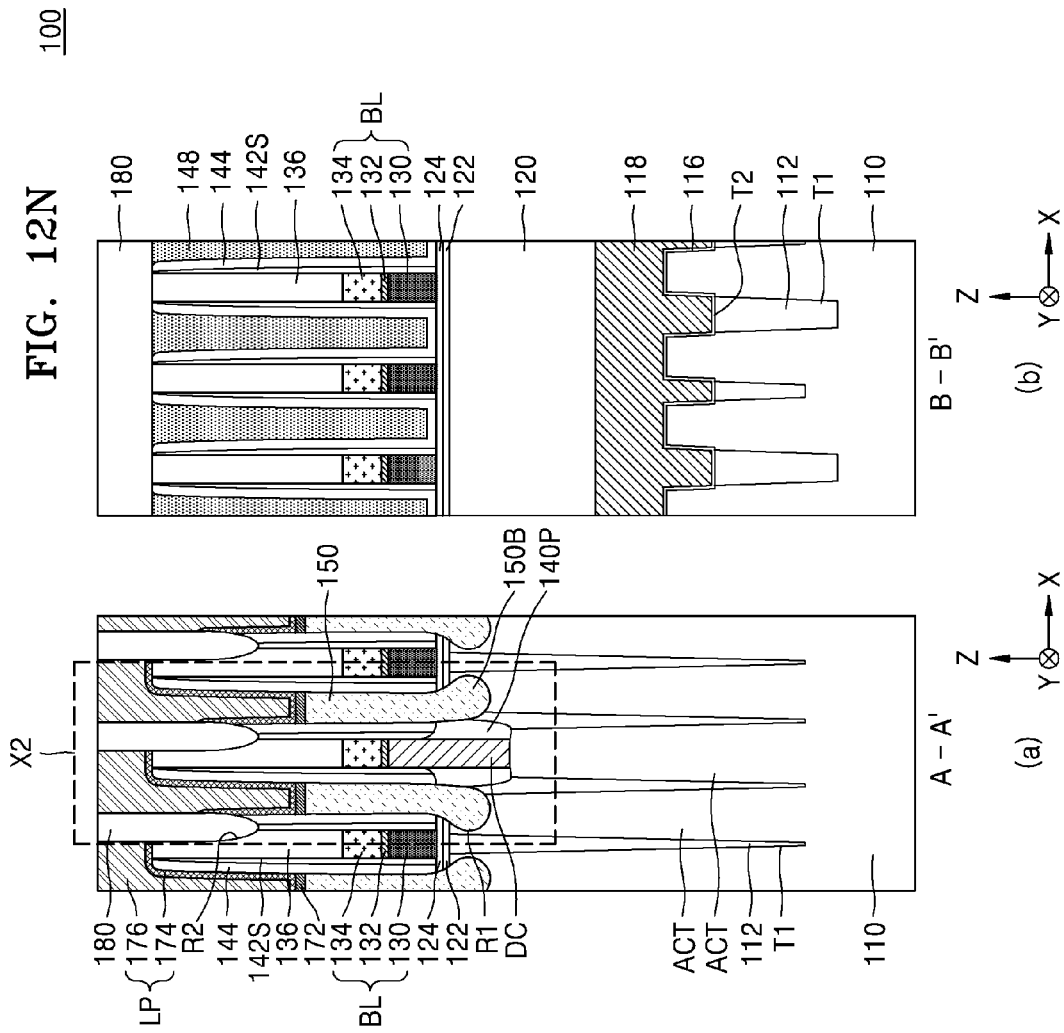

FIGS. 12A to 12N are diagrams of a process sequence of a method of manufacturing an IC device according to embodiments. In FIGS. 12A to 12N, (a) is a cross-sectional view of some components of a portion corresponding to a cross-section taken along the line A-A' of FIG. 1, according to the process sequence, and (b) is a cross-sectional view of some components of a portion corresponding to a cross-section taken along the line B-B' of FIG. 1, according to the process sequence. In FIGS. 12G to 12K, (c) is an enlarged cross-sectional view of a portion corresponding to a dashed region indicated by "X2" in (a) of the corresponding diagram. In FIGS. 12L and 12M, (c) is an enlarged plan view of a partial region of the corresponding diagram. A method of manufacturing the IC device 100 shown in FIGS. 2A and 2B, according to some example embodiments will now be described with reference to FIGS. 12A to 12N.

Referring to FIG. 12A, a device isolation trench T1 may be formed in a substrate 110, and a device isolation film 112 may be formed inside the device isolation trench T1.

A plurality of active regions ACT may be defined by the device isolation film 112 in the substrate 110. The device isolation film 112 may include an oxide film, a nitride film, or a combination thereof.

A plurality of word line trenches T2 may be formed in the substrate 110. The plurality of word line trenches T2 may extend in an X direction to be parallel to each other, and have line shapes across the active region ACT. To form the plurality of word line trenches T2 having stepped bottom surfaces, each of the device isolation film 112 and the substrate 110 may be etched using a separate etching process so that an etch depth of the device isolation film 112 may be different from an etch depth of the substrate 110. The resultant structure including the plurality of word line trenches T2 may be cleaned, and a gate dielectric film 116, a word line 118, and a buried insulating film 120 may be sequentially formed inside each of the plurality of word line trenches T2. Before or after the plurality of word lines 118 are formed, an ion implantation process for forming a plurality of source and drain regions in upper portions of the plurality of active regions ACT may be performed.

The gate dielectric film 116 may include at least one selected out of a silicon oxide film, a silicon nitride film, a silicon oxynitride film, oxide/nitride/oxide (ONO), or a high-k dielectric film having a higher dielectric constant than the silicon oxide film. The high-k dielectric film may include hafnium oxide ($HfO_2$), aluminium oxide ($Al_2O_3$), hafnium aluminium oxide ($HfAlO_3$), tantalum oxide ($Ta_2O_3$), titanium oxide ($TiO_2$), or a combination thereof. The plurality of word lines 118 may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. A plurality of buried insulating films 120 may include a silicon oxide film, a silicon nitride film, a silicon oxynitride film, or a combination thereof.

A first insulating film 122 and a second insulating film 124 may be sequentially formed on the substrate 110. The first insulating film 122 and the second insulating film 124 may be formed to cover top surfaces of the plurality of active regions ACT, a top surface of the device isolation film 112, and top surfaces of the plurality of buried insulating films 120. In some embodiments, the first insulating film 122 may include a silicon oxide film, and the second insulating film 124 may include a silicon nitride film, but they are not limited thereto.

Referring to FIG. 12B, a lower conductive layer 130 may be formed on the second insulating film 124. The lower conductive layer 130 may include doped polysilicon.

Referring to FIG. 12C, a mask pattern MP1 may be formed on the lower conductive layer 130, and the lower conductive layer 130 exposed through an opening MH of the mask pattern MP1 may then be etched to expose a portion of the substrate 110 and a portion of the device isolation film 112. The exposed portion of the substrate 110 and the exposed portion of the device isolation film 112 may be etched to form a direct contact hole DCH exposing the active region ACT of the substrate 110. The mask pattern MP1 may include an oxide film, a nitride film, or a combination thereof.

Referring to FIG. 12D, the mask pattern MP1 may be removed from the resultant structure of FIG. 12C, and a direct contact DC may be formed inside the direct contact hole DCH.

To form the direct contact DC, a conductive layer may be formed inside the direct contact hole DCH and on the lower conductive layer 130 to have a sufficient thickness for filling the direct contact hole DCH, and an excess/unnecessary portion of the conductive layer may be removed such that the conductive layer may remain only inside the direct contact hole DCH.

Referring to FIG. 12E, a middle conductive layer 132, an upper conductive layer 134, and a plurality of insulating capping patterns 136 may be sequentially formed on the lower conductive layer 130 and the direct contact DC. Each of the plurality of insulating capping patterns 136 may include a line pattern extending in a Y direction.

Referring to FIG. 12F, respective portions of the upper conductive layer 134, the middle conductive layer 132, the lower conductive layer 130, and the direct contact DC may be etched using the insulating capping patterns 136 as etch masks, thereby forming a plurality of bit lines BL on the substrate 110. The plurality of bit lines BL may include the respective remaining portions of the lower conductive layer 130, the middle conductive layer 132, and the upper conductive layer 134. After the plurality of bit lines BL are formed, a portion of the direct contact hole DCH may be exposed in the vicinity of the direct contact DC, and a line space LS may be defined between a plurality of bit line structures, each of which includes the bit line BL and the insulating capping pattern 136, and may elongate in the Y direction.

Referring to FIG. 12G, a boron-containing insulating film 140 may be formed to fill a remaining space of the direct contact hole DCH and cover sidewalls of each of the plurality of bit lines BL, the plurality of insulating capping patterns 136, and a plurality of direct contacts DC. The remaining space of the direct contact hole DCH may be completely filled with the boron-containing insulating film 140 in the vicinity of the direct contact DC.

The boron-containing insulating film 140 may have a dielectric constant of about 2 to 6. For example, the boron-containing insulating film 140 may have a dielectric constant of 3 to 5. In some embodiments, the boron-containing insulating film 140 may include a SiBN film. A boron (B) content of the SiBN film included in the boron-containing insulating film 140 may range from about 10 atomic percent (at %) to about 50 at %. For example, the boron-containing insulating film 140 may include $Si_xB_yN_z$ ($0.1 \leq x \leq 0.5$, $0.1 \leq y \leq 0.5$, and $0.1 \leq z \leq 0.8$).

The boron-containing insulating film 140 may be formed using a chemical vapor deposition (CVD) process or an atomic layer deposition (ALD) process. For example, the boron-containing insulating film 140 may be formed using a plasma-enhanced CVD (PECVD) process, a plasma impulse CVD (PICVD) process, or a plasma-enhanced ALD (PEALD) process. The formation of the boron-containing insulating film 140 including the SiBN film may be performed using a plasma deposition process so that boron (B) atoms may remain strongly bonded to nitrogen (N) atoms in the SiBN film.

In some embodiments, to form the boron-containing insulating film 140 including the SiBN film, a reaction between a silicon source and a nitrogen source may be caused in the atmosphere of a boron precursor. Diborane ($B_2H_6$), borazine ($B_3N_3H_6$), or a borazine derivative replaced by an alkyl group may be used as the boron precursor. Silane ($SiH_4$) or $SiCl_4$ gas may be used as the silicon source, and ammonia ($NH_3$) gas may be used as the nitrogen source. However, the precursors and the gas sources are only examples, and the inventive concepts are not limited thereto.

In some embodiments, a boron content in the boron-containing insulating film 140 may be constant in a thickness direction of the boron-containing insulating film 140. In some embodiments, the boron content in the boron-containing insulating film 140 may be variable in the thickness direction of the boron-containing insulating film 140.

During the formation of the boron-containing insulating film 140, a boron content or boron concentration of the boron-containing insulating film 140 may be controlled by adjusting a flow rate of the boron precursor. In some embodiments, the boron content in the boron-containing insulating film 140 may be variable in the thickness direction of the boron-containing insulating film 140. For example, the boron content in the boron-containing insulating film 140 may increase toward a bottom surface of the boron-containing insulating film 140 (i.e., toward an inner wall of the direct contact hole DCH and a sidewall of the direct contact DC), and be reduced toward a top surface of the boron-containing insulating film 140. The boron content in the boron-containing insulating film 140 may be highest in a portion in contact with the inner wall of the direct contact hole DCH and a portion in contact with the direct contact DC, and may be lowest in a surface that is exposed in the line space LS. Also, in a portion of the boron-containing insulating film 140 that covers the sidewalls of the bit line BL, the boron content in the boron-containing insulating film 140 may increase toward the bit line BL, and be reduced toward the surface exposed in the line space LS. Furthermore, in a portion of the boron-containing insulating film 140 that covers the sidewalls of the bit line BL, a nitrogen content in the boron-containing insulating film 140 may be reduced toward the bit line BL, and may increase in the surface exposed in the line space LS.

In some embodiments, to form the boron-containing insulating film 140 including the SiBN film, the flow rate of the boron precursor may be controlled to be relatively high in an initial stage of the process of depositing the boron-containing insulating film 140. As the process of depositing the boron-containing insulating film 140 proceeds, the flow rate of the boron precursor may be gradually reduced and the flow rate of the nitrogen source may gradually increase. Thus, since a boron content of the boron-containing insulating film 140 increases toward the bottom surface of the boron-containing insulating film 140, a dielectric constant of the boron-containing insulating film 140 may be reduced toward the bottom surface. In contrast, since the boron content of the boron-containing insulating film 140 is reduced toward the top surface of the boron-containing insulating film 140, the dielectric constant of the boron-containing insulating film 140 may increase toward the top surface. However, since the nitrogen content of the boron-containing insulating film 140 increases toward the top surface of the boron-containing insulating film 140, a dry etching resistance may increase toward the top surface of the boron-containing insulating film 140. Accordingly, when a dry etching process for removing portions of structures exposed through a plurality of contact spaces CS is performed a plurality of recess spaces R1 as described below with reference to FIG. 12L, even if a boron-containing insulating filling pattern 140P formed using the boron-containing insulating film 140 is exposed to a dry etching atmosphere, the boron-containing insulating filling pattern 140P may be inhibited/prevented from being undesirably consumed due to the dry etching atmosphere.

Referring to FIG. 12H, the boron-containing insulating film 140 may be isotropically etched from the resultant structure of FIG. 12G, thereby forming a boron-containing insulating filling pattern 140P including the remaining (after the etch) portion of the boron-containing insulating film 140.

In some embodiments, the isotropic etching process may be performed using phosphoric acid, sulfuric acid, a combination of phosphoric acid and sulfuric acid, a mixture of phosphoric acid and deionized water (DIW), a mixture of sulfuric acid and DIW, a mixture of phosphoric acid and fluoric acid, or a mixture of sulfuric acid and fluoric acid. The boron-containing insulating filling pattern 140P may include a portion of the boron-containing insulating film 140, which may fill the inside of the direct contact hole DCH, and a portion covering an entrance of the direct contact hole DCH outside the entrance of the direct contact hole DCH.

Referring to FIG. 12I, a first insulating spacer layer 142 may be formed to conformally cover respective exposed surfaces of the plurality of bit lines BL, the plurality of insulating capping patterns 136, and the boron-containing insulating filling pattern 140P. The first insulating spacer layer 142 may include a material having a different etch selectivity from that of the boron-containing insulating filling pattern 140P. For example, the first insulating spacer layer 142 may include a silicon oxide film. The first insulating spacer layer 142 may be formed using a CVD process or an ALD process.

Referring to FIG. 12J, the first insulating spacer layer 142 may be anisotropically etched from the resultant structure of FIG. 12I to form a plurality of first insulating spacers 142S. Each of the plurality of first insulating spacers 142S may cover a sidewall of the bit line BL and a sidewall of the insulating capping pattern 136 on the boron-containing insulating filling pattern 140P and the second insulating film 124. After the plurality of first insulating spacers 142S are formed, a portion of the boron-containing insulating filling pattern 140P may be exposed again.

Referring to FIG. 12K, second insulating spacers 144 may be formed to conformally cover the resultant structure of FIG. 12J. The second insulating spacers 144 may include a material having a different etch selectivity from that of each of the first insulating spacer layer 142 and the boron-containing insulating filling pattern 140P. For example, the second insulating spacers 144 may include a silicon nitride film. The second insulating spacers 144 may be formed using a CVD process or an ALD process.

Referring to FIG. 12L, a plurality of insulating fences 148 may be formed between the respective bit lines BL and spaced apart from each other so that the line space LS defined by the second insulating spacers 144 may be separated into a plurality of contact spaces CS.

Each of the plurality of insulating fences 148 may be formed to vertically overlap the word line 118 on the word line 118. The plurality of insulating fences 148 may include a silicon nitride film. In some embodiments, portions of the plurality of insulating capping patterns 136 may be consumed during the formation of the plurality of insulating fences 148 to reduce a height of the plurality of insulating capping patterns 136.

Thereafter, portions of structures exposed through the plurality of contact spaces CS may be removed, thereby forming a plurality of recess spaces R1 exposing the active region ACT of the substrate 110 between the respective bit lines BL.

The plurality of recess spaces R1 may be formed using an anisotropic etching process or a combination of the anisotropic etching process and an isotropic etching process. For example, of the structures exposed through the plurality of contact spaces CS between the respective bit lines BL, the second insulating spacers 144, the second insulating film 124, and the first insulating film 122 may be sequentially anisotropically etched. As a result, portions of the active region ACT of the substrate 110 may be exposed, and the exposed portions of the active region ACT may be etched to form the plurality of recess spaces R1. The plurality of recess spaces R1 may communicate (i.e., be connected) with the contact spaces CS, respectively. The active region ACT of the substrate 110 and the boron-containing insulating filling pattern 140P may be exposed through the plurality of recess spaces R1.

Referring to FIG. 12M, a plurality of contact plugs 150 may be formed between the respective bit lines BL to fill the plurality of recess spaces R1 and portions of the plurality of contact spaces CS between the respective bit lines BL.

A vertical distance from a top surface of the substrate 110 to a top surface of each of the plurality of contact plugs 150 may be greater than a vertical distance from the top surface of the substrate 110 to a top surface of each of the plurality of bit lines BL.

Referring to FIG. 12N, a metal silicide film 172 and a plurality of conductive landing pads LP may be sequentially formed on the plurality of contact plugs 150, which are exposed through the plurality of contact spaces CS (refer to FIG. 12M).

The contact plug 150 and the metal silicide film 172 may constitute at least a portion of the buried contact BC shown in FIG. 1. The plurality of conductive landing pads LP may extend to upper portions of the insulating capping patterns 136 to fill the plurality of contact spaces CS on the metal silicide film 172 and vertically overlap portions of the plurality of bit lines BL. The plurality of conductive landing pads LP may include a conductive barrier film 174 and a conductive layer 176.

To form the plurality of conductive landing pads LP, the conductive barrier film 174 and the conductive layer 176 may be formed on the entire surface of the resultant structure including the metal silicide film 172. Thereafter, a mask pattern may be formed on the conductive layer 176 to expose portions of the conductive layer 176. The conductive layer 176, the conductive barrier film 174, and insulating films located in the vicinities thereof may be etched using the mask pattern as an etch mask, thereby forming upper recess spaces R2. The mask pattern may include a silicon nitride film, but is not limited thereto.

The plurality of conductive landing pads LP may be formed as a plurality of island patterns. Portions of the plurality of conductive landing pads LP, which may extend in a horizontal direction outside the contact spaces CS, may constitute the plurality of conductive landing pads LP shown in FIG. 1.

The upper recess spaces R2 may be filled with the insulating film 180 in the vicinity of the plurality of conductive landing pads LP so that the plurality of conductive landing pads LP may be electrically insulated from each other. Thereafter, a plurality of capacitor lower electrodes may be formed on the insulating film 180 and electrically connectable to the plurality of conductive landing pads LP.

To manufacture the IC device 100A shown in FIGS. 3A and 3B, the plurality of conductive landing pads LP may be formed using the process described with reference to FIG. 12N. Thereafter, before the upper recess spaces R2 are filled with the insulating film 180, the plurality of first insulating spacers 142S may be removed using a wet etching process through the upper recess spaces R2. Thus, air spacers AS1 may be formed between the bit lines BL and the second insulating spacers 144.

FIGS. 13A to 13D show cross-sectional views of a process sequence of a method of manufacturing an IC device according to embodiments. In FIGS. 13A to 13D, (a) is a cross-sectional view of some components of a portion corresponding to a cross-section taken along the line A-A' of FIG. 1, according to the process sequence, (b) is a cross-sectional view of some components of a portion corresponding to a cross-section taken along a B-B' of FIG. 1, according to the process sequence, and (c) is an enlarged cross-sectional view of a portion corresponding to a dashed region indicated by "X2" in (a) of the corresponding diagram. A method of manufacturing the IC device shown in FIGS. 4A and 4B, according to some example embodiments, will be described with reference to FIGS. 13A to 13D. In FIGS. 13A to 13D, the same reference numerals are used to denote the same elements as in FIGS. 4A, 4B, and 12A to 12N, and a repeated detailed description thereof will be omitted.

Referring to FIG. 13A, the processes described with reference to FIGS. 12A to 12F may be performed to form a plurality of bit lines BL on a substrate 110. Thereafter, an inside insulating film 242 may be formed to conformally cover the plurality of bit lines BL, a plurality of insulating capping patterns 136, exposed surfaces of respective direct contacts DC, an inner wall of a direct contact hole DCH, and a top surface of a second insulating film 124.

Subsequently, a boron-containing insulating film 140 may be formed on the inside insulating film 242 using a method similar to that described with reference to FIG. 12G. A remaining space of the direct contact hole DCH may be completely filled with the boron-containing insulating film 140 in the vicinity of the direct contact DC. A thickness of the inside insulating film 242 may be less than a thickness of the boron-containing insulating film 140.

Figure 13B:
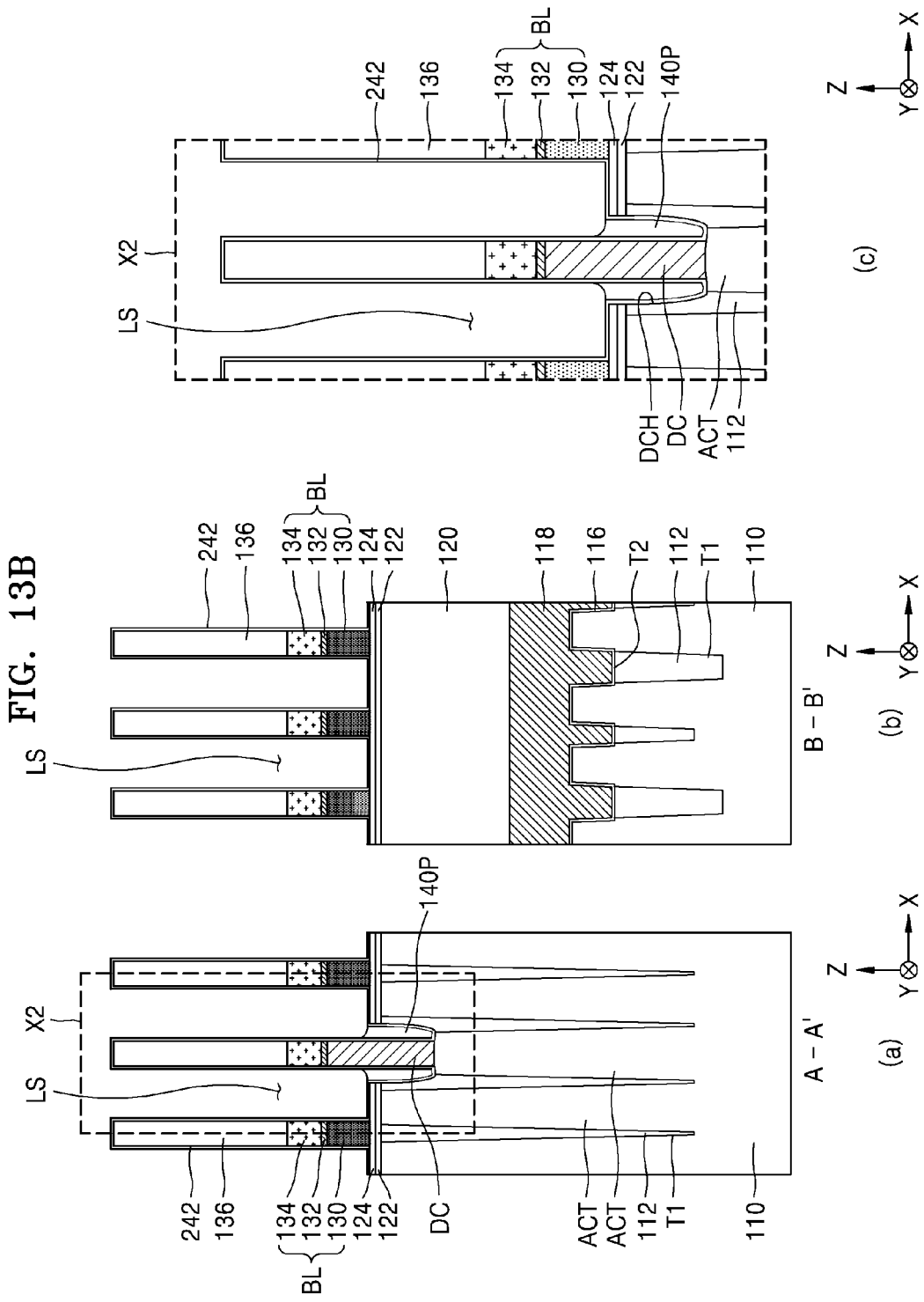

Referring to FIG. 13B, the boron-containing insulating film 140 may be isotropically etched from the resultant structure of FIG. 13A using a method similar to that described with reference to FIG. 12H, thereby forming a boron-containing insulating filling pattern 140P including the remaining (after the etch) portion of the boron-containing insulating film 140. The boron-containing insulating filling pattern 140P may be located apart from the direct contact DC with the inside insulating film 242 therebetween.

Referring to FIG. 13C, a plurality of first insulating spacers 142S may be formed on the boron-containing insulating filling pattern 140P and the inside insulating film 242 to cover a sidewall of the bit line BL and a sidewall of the insulating capping pattern 136 using a method similar to that described with reference to FIGS. 12I and 12J. The plurality of first insulating spacers 142S may be located apart from the bit line BL and the insulating capping pattern 136 with the inside insulating film 242 therebetween.

The plurality of first insulating spacers 142S may be formed by anisotropically etching the first insulating spacer layer 142 as described with reference to FIG. 12J. Thereafter, portions of the inside insulating film 242, which may cover a top surface of the insulating capping pattern 136 and be exposed on bottoms of the plurality of line spaces LS may be continuously etched to expose the top surface of the insulating capping pattern 136, the top surface of the second insulating film 124, and a top surface of the boron-containing insulating filling pattern 140P.

Figure 13D:
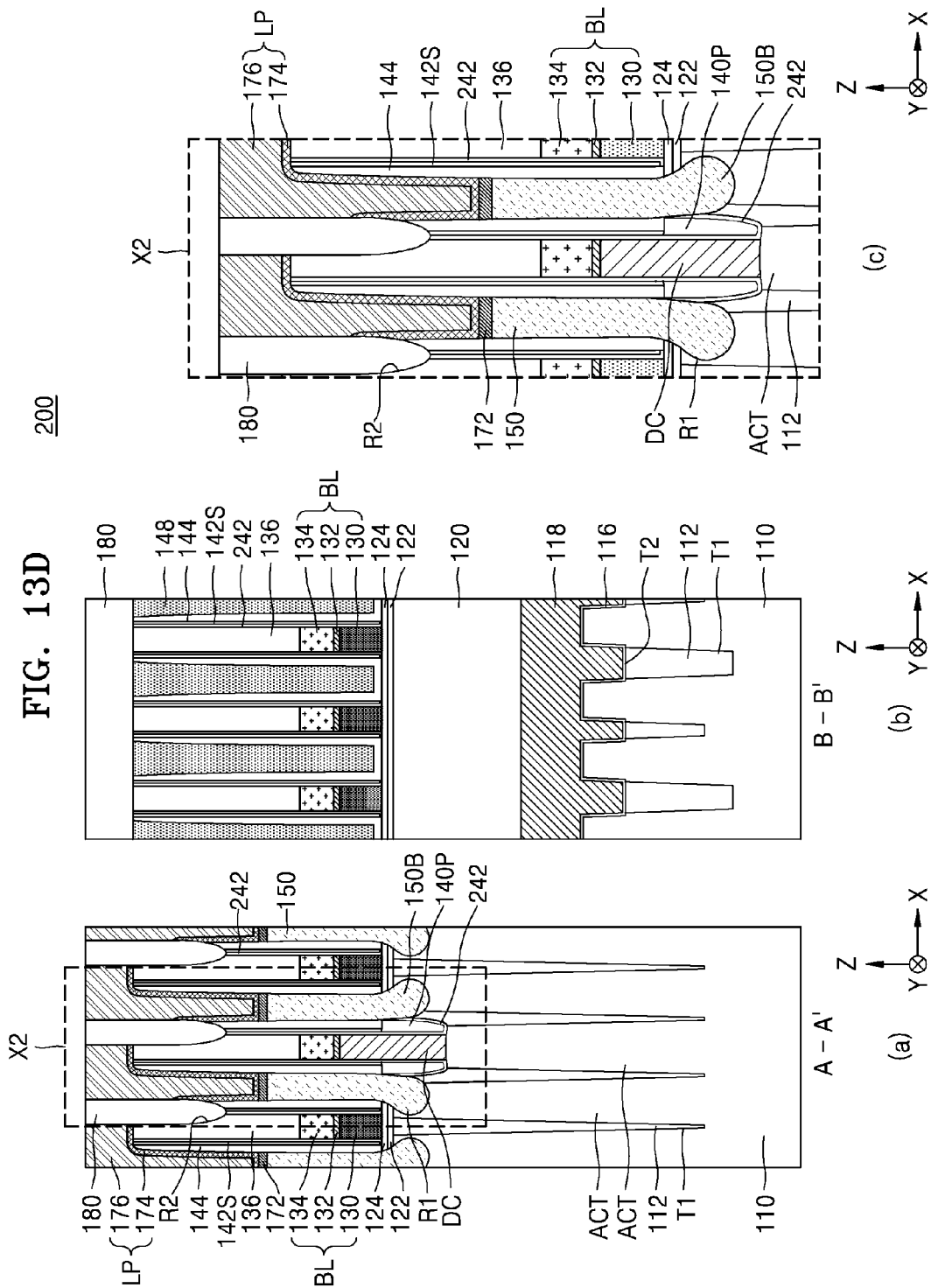

Referring to FIG. 13D, the processes described with reference to FIGS. 12K to 12N may be performed on the resultant structure of FIG. 13C. Thus, second insulating spacers 144 may be formed to cover the plurality of first insulating spacers 142S, a plurality of insulating fences 148, a plurality of contact plugs 150, a plurality of metal silicide films 172, and a plurality of conductive landing pads LP may be formed, and an insulating film 180 may be formed to fill upper recess spaces R2. Thus, the IC device 200 shown in FIGS. 4A and 4B may be manufactured.

To manufacture the IC device 200A shown in FIGS. 5A and 5B and the IC device 200B shown in FIG. 6, after the plurality of conductive landing pads LP are formed using the process described with reference to FIG. 13D and before the upper recess spaces R2 are filled with the insulating film 180, the plurality of first insulating spacers 142S and the inside insulating film 242 may be removed by using a wet etching process through the upper recess spaces R2 so that an air spacer AS21 may be formed between the bit line BL and the second insulating spacer 144. During the wet etching process for forming the air spacer AS21, a portion of the inside insulating film 242 interposed between the direct contact DC and the boron-containing insulating filling pattern 140P may be removed, so that the gap air portion G21 shown in FIG. 5A may be formed and an inside insulating film 242G1 may remain in the vicinity of the boron-containing insulating filling pattern 140P. In addition, a removed amount of the inside insulating film 242 interposed between the direct contact DC and the boron-containing insulating filling pattern 140P may be adjusted during the wet etching process so that an air spacer AS22 including a gap air portion G22 and an inside insulating film 242G2 may remain as in the IC device 200B shown in FIG. 6.

Figure 14A:
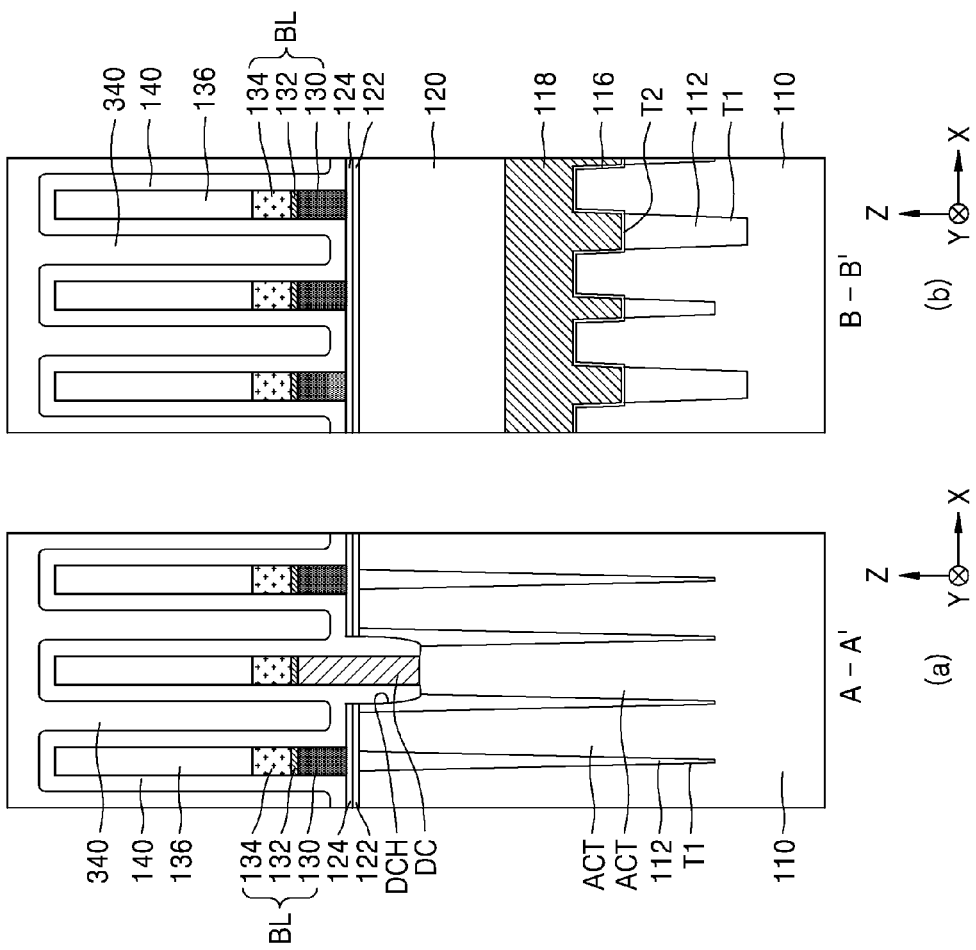
Figure 14B:
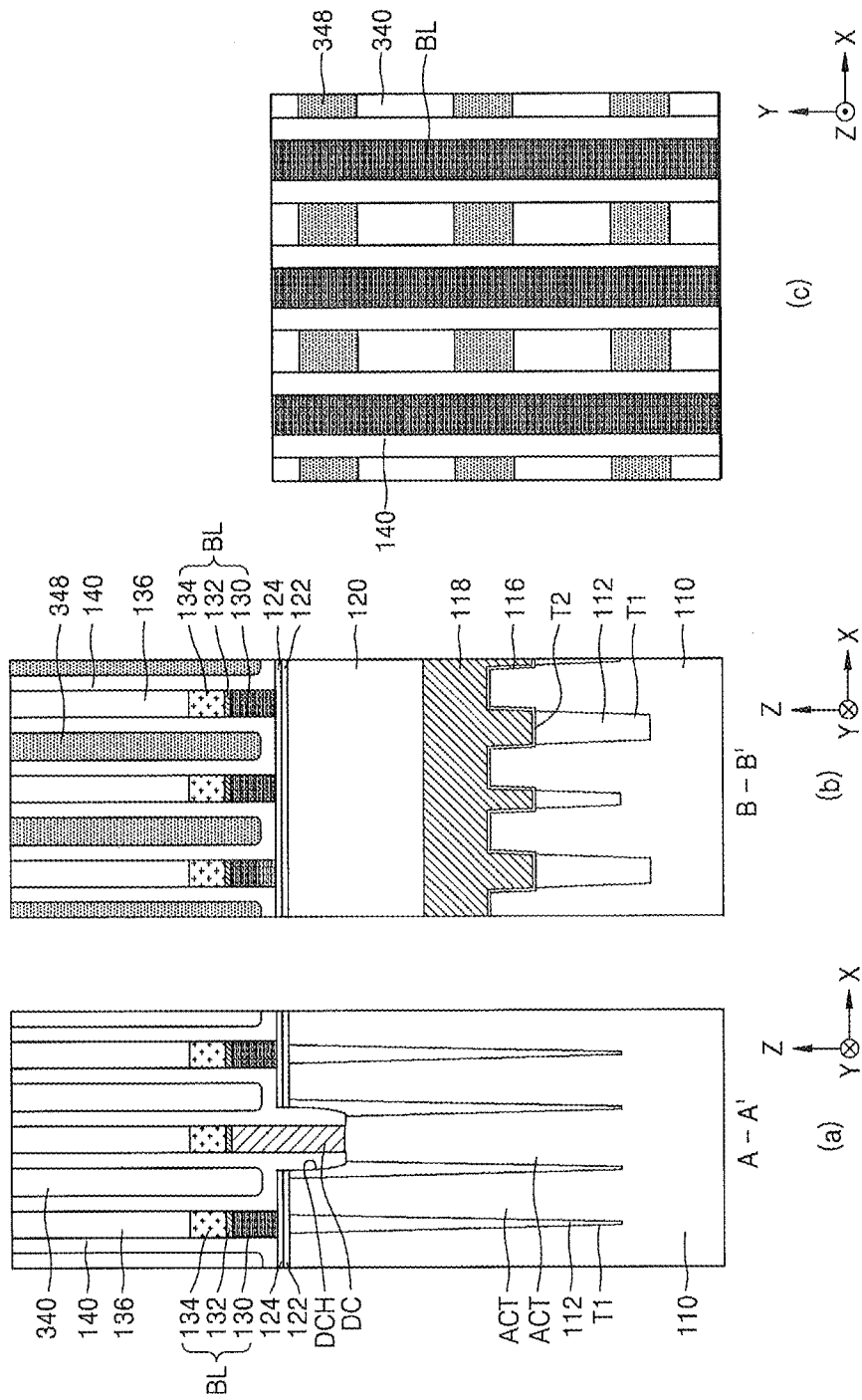
Figure 14C:
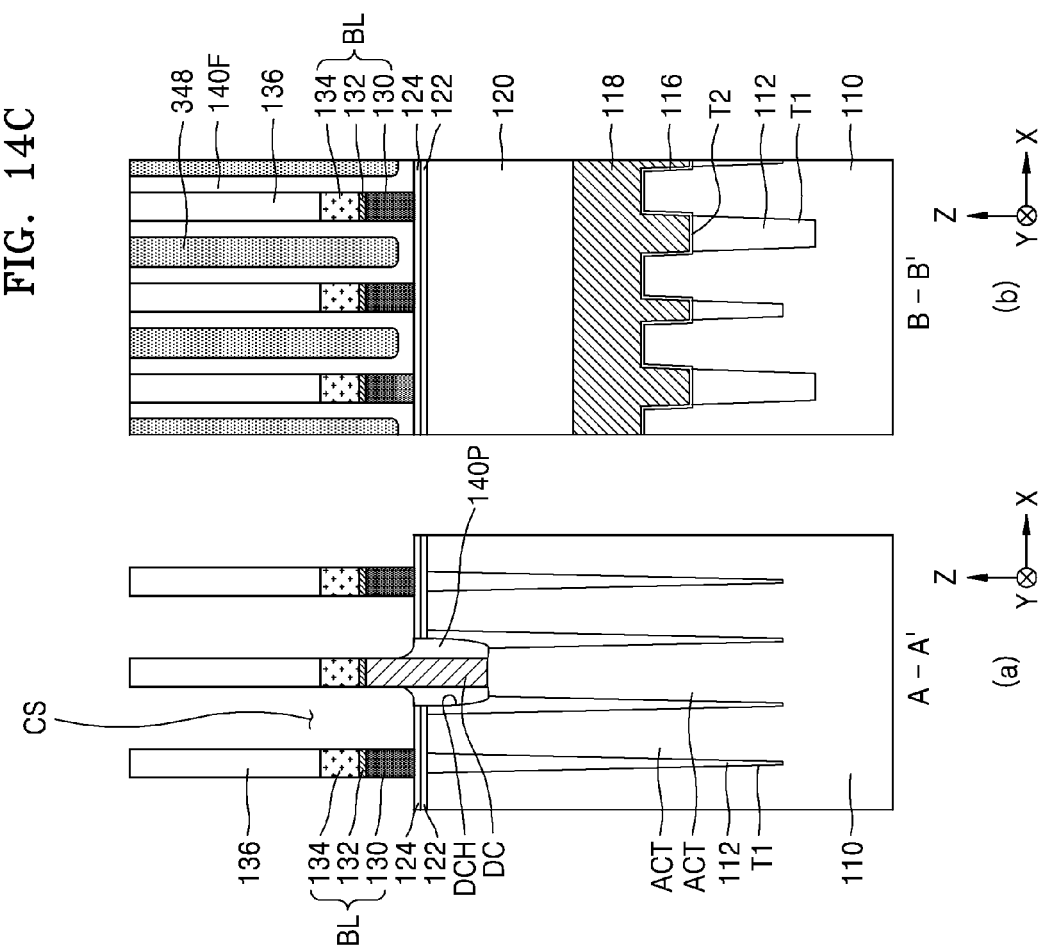
Figure 14E:
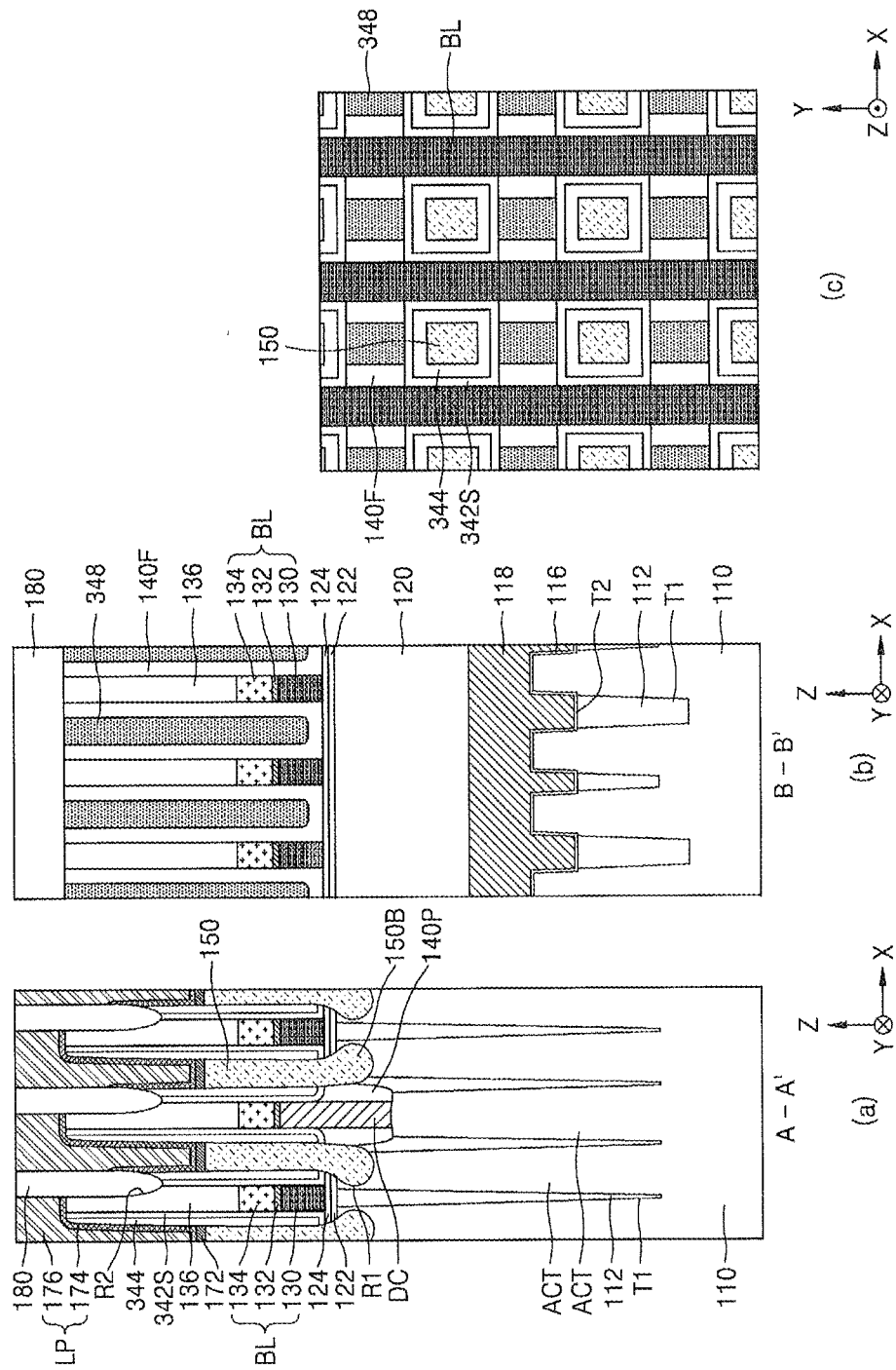

FIGS. 14A to 14E are diagrams of a process sequence of a method of manufacturing an IC device according to embodiments. In FIGS. 14A to 14E, (a) is a cross-sectional view of some components of a portion corresponding to a cross-section taken along the line A-A' of FIG. 1, according to the process sequence, and (b) is a cross-sectional view of some components of a portion corresponding to a cross-section taken along the line B-B' of FIG. 1, according to the process sequence. In FIGS. 14B, 14D, and 14E, (c) is an enlarged plan view of a partial region of the corresponding diagram. A method of manufacturing the IC device 300 shown in FIGS. 7A and 7B, according to some example embodiments, will be described with reference to FIGS. 14A to 14E. In FIGS. 14A to 14E, the same reference numerals are used to denote the same elements as in FIGS. 7A, 7B, and 12A to 12N, and a repeated detailed description thereof will be omitted.

Referring to FIG. 14A, the processes described with reference to FIGS. 12A to 12G may be performed to form a boron-containing insulating film 140 on a substrate 110. Thereafter, an interlayer insulating film 340 may be formed to fill line spaces LS between a plurality of bit line structures, each of which includes a bit line BL and an insulating capping pattern 136.

In some embodiments, the interlayer insulating film 340 may include a silicon oxide film. In a process of forming the interlayer insulating film 340 according to an embodiment, a polysilazane-based insulating film may be formed to fill the line spaces LS (refer to FIG. 12G) using a CVD process or a spin-on-glass (SOG) coating process. Thereafter, the polysilazane-based insulating film may be annealed at a temperature of about 300° C. to about 600° C. and densified due to a crosslinking reaction of silicon-oxide-silicon (Si—O—Si) networks, thereby forming the silicon oxide film.

During the annealing of the polysilazane-based insulating film, the boron-containing insulating film 140 may serve to inhibit/prevent oxidation of a plurality of bit lines BL.

Referring to FIG. 14B, a planarization process may be performed on a top surface of the resultant structure of FIG. 14A so that a portion of each of the interlayer insulating film 340 and the insulating capping patterns 136 may be removed and a top surface of each of the insulating capping patterns 136 may be exposed. Next, portions of the interlayer insulating film 340 may be removed to empty partial regions of the line spaces LS between the respective bit lines BL. Thereafter, a plurality of insulating fences 348 may be formed to fill the emptied partial regions of the line spaces LS.

Referring to FIG. 14C, the interlayer insulating film 340 remaining between the plurality of bit lines BL may be removed from the resultant structure of FIG. 14B so that contact spaces CS may be prepared between the respective insulating fences 348. The boron-containing insulating film 140 may be exposed through a plurality of contact spaces CS defined by the plurality of insulating fences 348 between the respective bit lines BL. Thereafter, the boron-containing insulating film 140 exposed through the plurality of contact spaces CS may be isotropically etched to form a boron-containing insulating filling pattern 140P that exposes sidewalls of each of the plurality of bit lines BL and the plurality of insulating capping patterns 136 in the plurality of contact spaces CS and covers both (i.e., opposing) sidewalls of a direct contact DC.

After the boron-containing insulating filling pattern 140P is formed, portions of the boron-containing insulating film 140, which may be interposed between the bit line structure including the bit line BL and the insulating capping pattern 136 and the plurality of insulating fences 348, may remain as boron-containing insulating fences 140F. Each of the boron-containing insulating fences 140F may have a substantially U sectional shape to cover a bottom surface and both (i.e., opposing) sidewalls of the insulating fence 348.

Referring to FIG. 14D, a silicon oxide film and a silicon nitride film may be sequentially formed to conformally cover the resultant structure of FIG. 14C. Thereafter, the silicon oxide film and the silicon nitride film may be anisotropically etched to form first insulating spacers 342S and second insulating spacers 344 inside the plurality of contact spaces CS, respectively. The first insulating spacers 342S may include the remaining portion of the silicon oxide film, and the second insulating spacers 344 may include the remaining portion of the silicon nitride film. Each of the first insulating spacers 342S and the second insulating spacers 344 may have a ring shape and conformally cover an inner wall of the contact space CS.

Thereafter, portions of structures exposed through the plurality of contact spaces CS may be removed using a method similar to that described with reference to FIG. 12L, thereby forming a plurality of recess spaces R1 exposing active regions ACT of a substrate 110. The plurality of recess spaces R1 may communicate (i.e., be connected) with the contact spaces CS, respectively. The active regions ACT of the substrate 110 and the boron-containing insulating filling pattern 140P may be exposed through the plurality of recess spaces R1.

Referring to FIG. 14E, a plurality of contact plugs 150, a plurality of metal silicide films 172, a plurality of conductive landing pads LP, and an insulating film 180 filling upper recess spaces R2 may be formed, by using a method described with reference to FIGS. 12M to 12N. Thus, the IC device 300 shown in FIGS. 7A and 7B may be manufactured.

To form the IC device 300A shown in FIGS. 8A and 8B, after the plurality of conductive landing pads LP are formed using the process described with reference to FIG. 14E and before the upper recess spaces R2 are filled with the insulating film 180, a plurality of first insulating spacers 342S may be removed using a wet etching process through the upper recess spaces R2 so that an air spacer AS3 may be formed between the bit line BL and the second insulating spacer 344 and between the insulating fence 348 and the second insulating spacer 344.

Figure 15B:
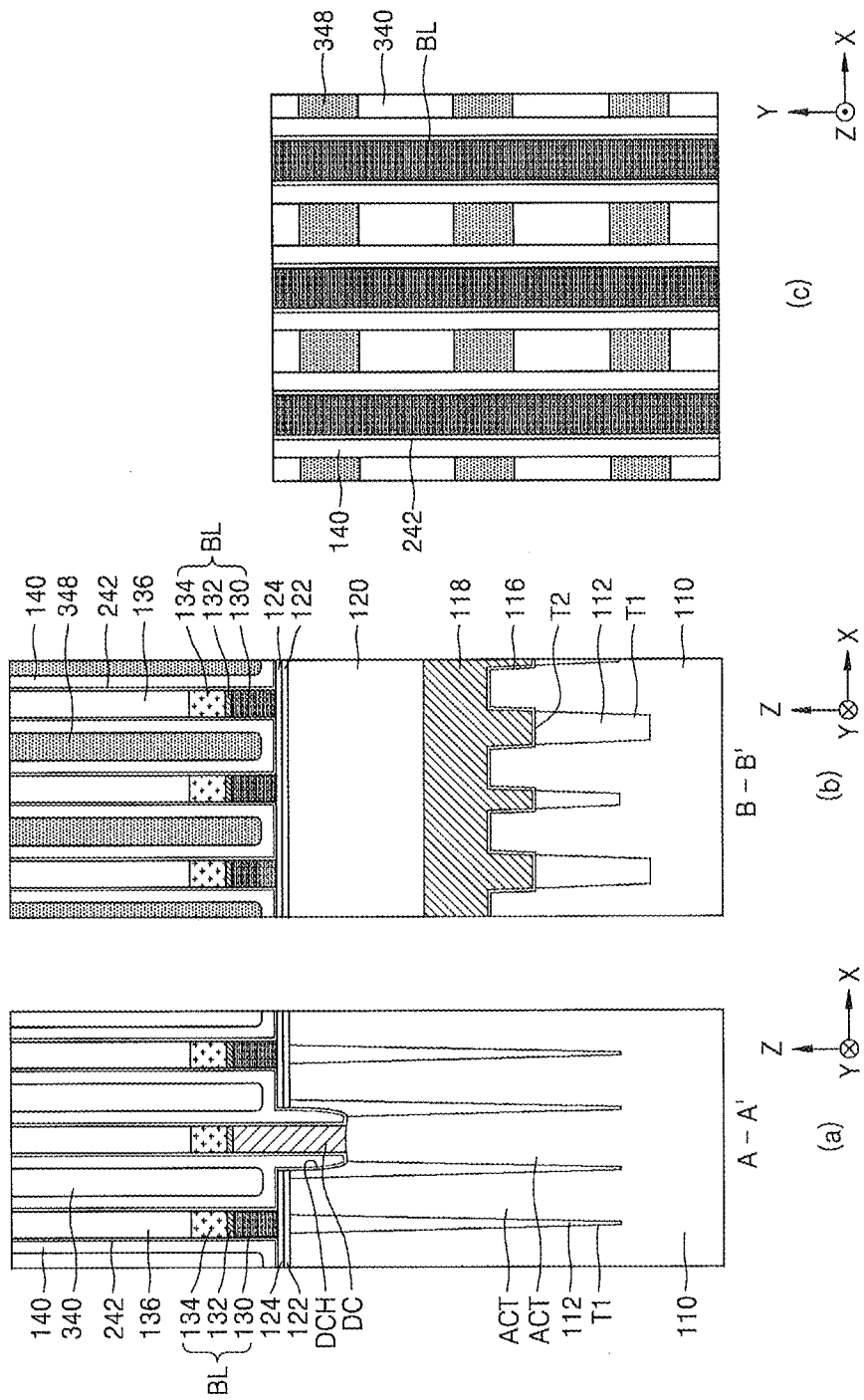
Figure 15C:
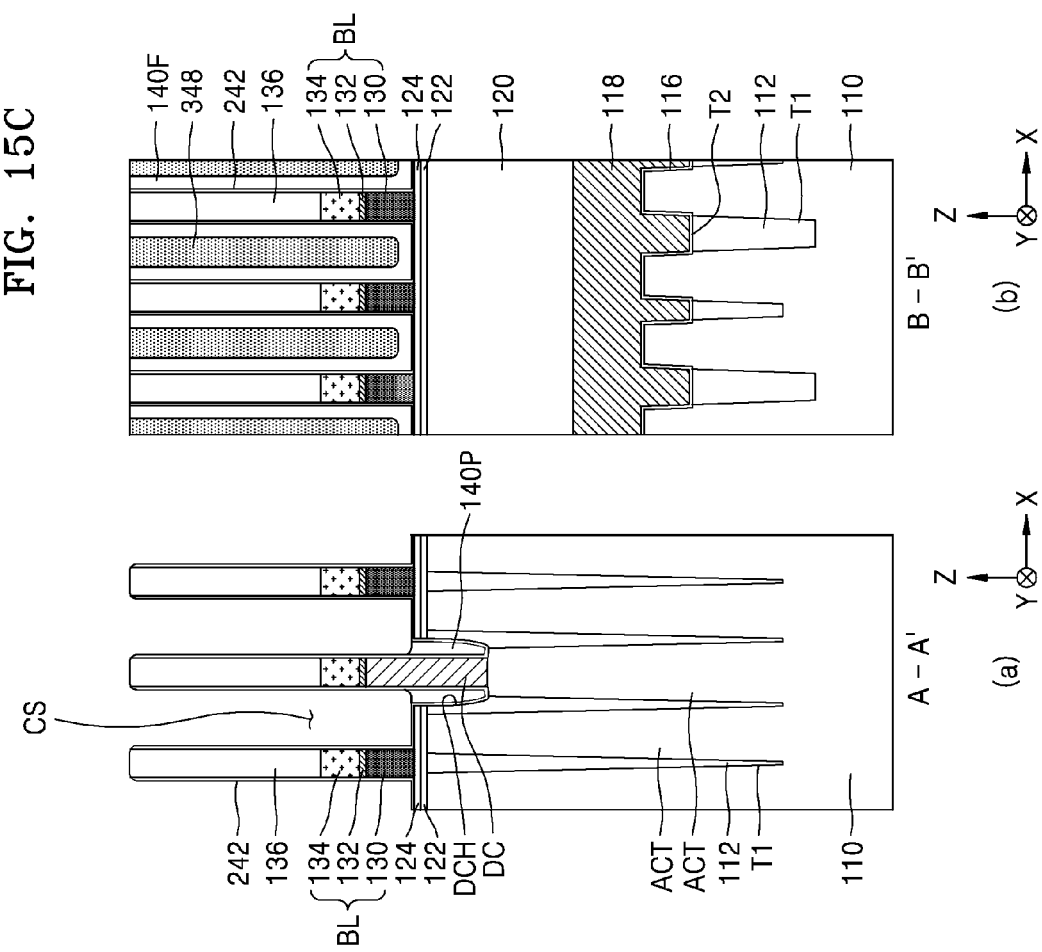
Figure 15D:
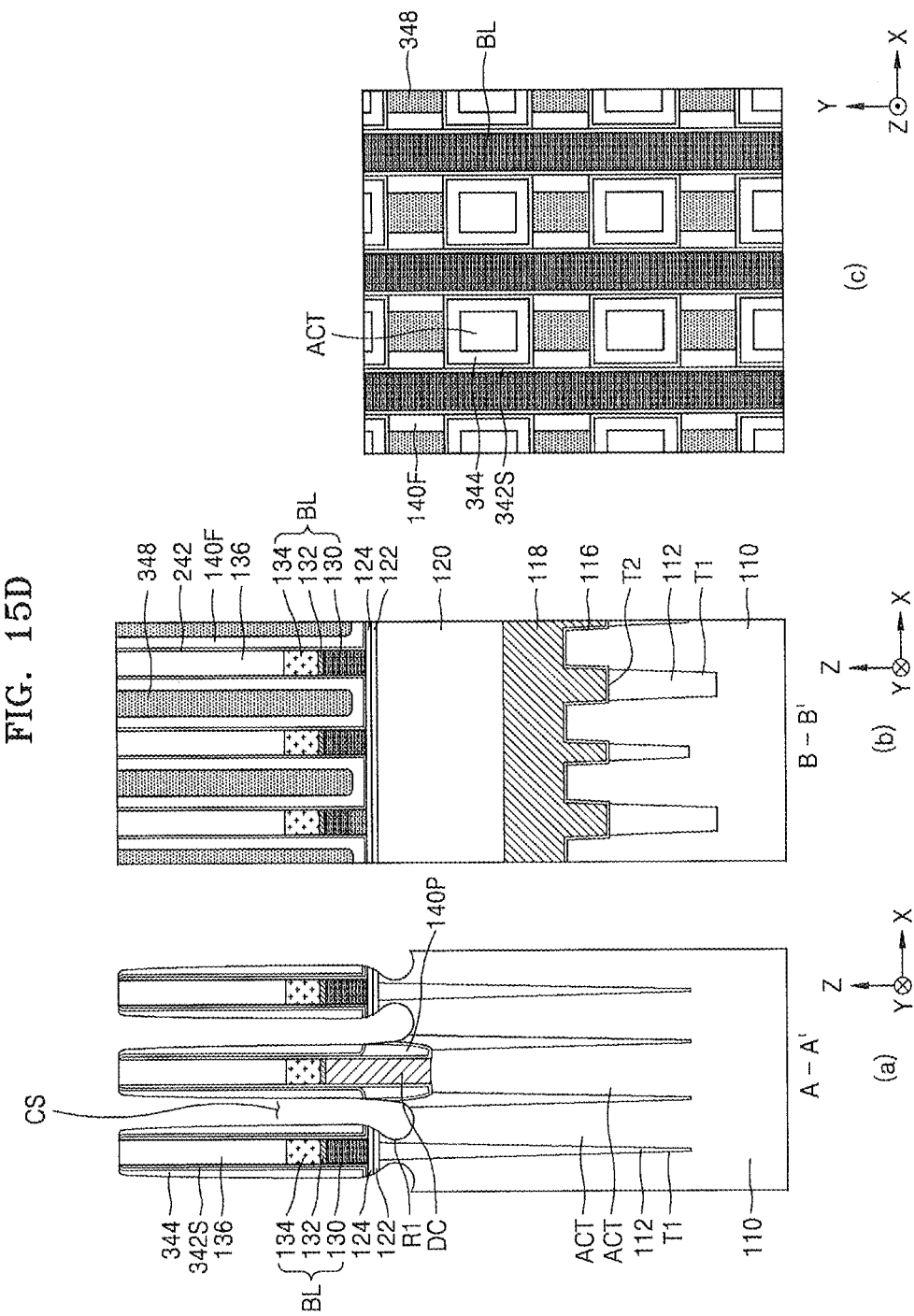
Figure 15E:
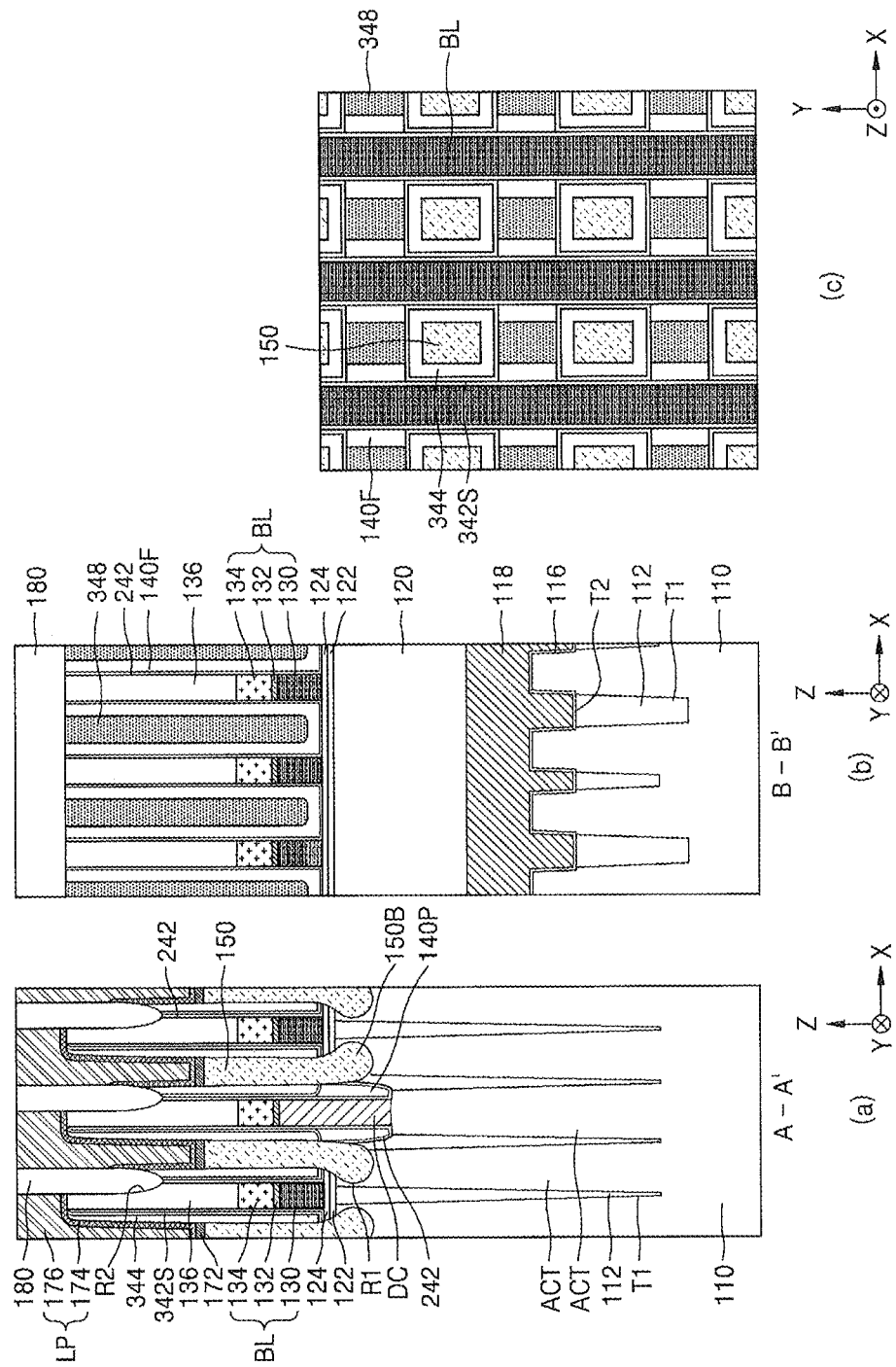

FIGS. 15A to 15E are diagrams of a process sequence of a method of manufacturing an IC device according to embodiments. In FIGS. 15A to 15E, (a) is a cross-sectional view of some components of a portion corresponding to a cross-section taken along the line A-A' of FIG. 1, according to the process sequence, and (b) is a cross-sectional view of some components of a portion corresponding to a cross-section taken along the line B-B' of FIG. 1, according to the process sequence. In FIG. 15A, (c) is an enlarged cross-sectional view of a portion corresponding to a dashed region indicated by "X2" in (a). In FIGS. 15B, 15D, and 15E, (c) is an enlarged plan view of a partial region of the corresponding diagram. A method of manufacturing the IC device 400 shown in FIGS. 9A and 9B, according to some example embodiments, will be described with reference to FIGS. 15A to 15E.

Referring to FIG. 15A, the processes described with reference to FIGS. 12A to 12F may be performed to form a plurality of bit lines BL on a substrate 110. Next, an inside insulating film 242 and a boron-containing insulating film 140 may be formed using a method similar to that described with reference to FIG. 13A. Thereafter, an interlayer insulating film 340 may be formed to cover the boron-containing insulating film 140, by using a method similar to that described with reference to FIG. 14A.

Referring to FIG. 15B, portions of the interlayer insulating film 340 may be removed using a method similar to that described with reference to FIG. 14B, and a plurality of insulating fences 348 may then be formed to fill partial regions of line spaces LS on the boron-containing insulating film 140.

Referring to FIG. 15C, the interlayer insulating film 340, which may remain between the plurality of bit lines BL, may be removed from the resultant structure of FIG. 15B using a method similar to that described with reference to FIG. 14C. Thereafter, the boron-containing insulating film 140, which may be exposed through a plurality of contact spaces CS, may be isotropically etched to form a boron-containing insulating filling pattern 140P, which may expose the inside insulating film 242 in the plurality of contact spaces CS and cover both (i.e., opposing) sidewalls of a direct contact DC. Portions of the boron-containing insulating film 140 may remain (after the etch) as boron-containing insulating fences 140F covering bottom surfaces and both (i.e., opposing) sidewalls of the insulating fences 348.

Referring to FIG. 15D, a first insulating spacer 342S and a second insulating spacer 344 may be formed in each of the plurality of contact spaces CS using a method similar to that described with reference to FIG. 14D. Thereafter, portions of structures exposed through the plurality of contact spaces CS may be removed to form a plurality of recess spaces R1 exposing an active region ACT of the substrate 110.

Referring to FIG. 15E, a plurality of contact plugs 150, a plurality of metal silicide films 172, a plurality of conductive landing pads LP, and an insulating film 180 filling upper recess spaces R2 may be formed, by using a method similar to that described with reference to FIGS. 12M and 12N. Thus, the IC device 400 shown in FIGS. 9A and 9B may be manufactured.

To manufacture the IC device 400A shown in FIGS. 10A and 10B and the IC device 400B shown in FIG. 11, after the plurality of conductive landing pads LP are formed using the process described with FIG. 15E and before the upper recess spaces R2 are filled with the insulating film 180, a plurality of inside insulating films 242 and a plurality of first insulating spacers 342S may be removed using a wet etching process through the upper recess spaces R2. Thus, an air spacer AS41 may be formed between the bit line BL and the second insulating spacer 344 and between the insulating fence 348 and the second insulating spacer 344. During the wet etching process for forming the air spacer AS41, a portion of the inside insulating film 242 interposed between the direct contact DC and the boron-containing insulating filling pattern 140P may be removed, so that the gap air portion G41 shown in FIG. 10A may be formed, and an inside insulating film 242G4 may remain in the vicinity of the boron-containing insulating filling pattern 140P. In addition, a removed amount of the inside insulating film 242 interposed between the direct contact DC and the boron-containing insulating filling pattern 140P may be adjusted during the wet etching process so that an air spacer AS42 including a gap air portion G42 and an inside insulating film 242G5 may remain as in the IC device 400B shown in FIG. 11.

While methods of manufacturing IC devices according to example embodiments of the inventive concepts have been shown and described with reference to FIGS. 12A to 15E, it will be understood that various changes in form and details may be made therein within the scope of the inventive concepts, and variously modified and changed IC devices may be manufactured as described with reference to FIGS. 12A to 15E.

Though the inventive concepts have been particularly shown and described with reference to example embodiments thereof, it will be understood that various changes in form and details may be made therein without departing from the scope of the following claims.

What is claimed is:

1. An integrated circuit device comprising:
   a substrate comprising a first active region and a second active region that are spaced apart from each other;
   a bit line that extends in a horizontal direction on the substrate;
   a direct contact connected between the first active region and the bit line;
   a contact plug that extends in a vertical direction on the substrate, the contact plug comprising an upper portion adjacent the bit line and a lower portion in contact with the second active region in the substrate; and
   a boron-containing insulating pattern between the lower portion of the contact plug and the direct contact,
   wherein the boron-containing insulating pattern comprises $Si_xB_yN_z$, and
   wherein $0.1 \leq x \leq 0.5$, $0.1 \leq y \leq 0.5$, and $0.1 \leq z \leq 0.8$.

2. The integrated circuit device of claim 1, wherein the boron-containing insulating pattern comprises a dielectric constant of 2 to 6.

3. The integrated circuit device of claim 1, wherein the lower portion of the contact plug and the direct contact are both in contact with the boron-containing insulating pattern.

4. The integrated circuit device of claim 1, further comprising an insulating region between the lower portion of the contact plug and the boron-containing insulating pattern and between the direct contact and the boron-containing insulating pattern,
   wherein the insulating region comprises a lower dielectric constant than a dielectric constant of the boron-containing insulating pattern.

5. The integrated circuit device of claim 4, wherein the insulating region comprises a silicon oxide film, an air spacer, or a combination thereof.

6. The integrated circuit device of claim 1, wherein the boron-containing insulating pattern is buried in the substrate.

7. The integrated circuit device of claim 1, further comprising a boron-containing insulating fence on a sidewall of the bit line,
   wherein a boron content in the boron-containing insulating fence increases toward the bit line.

8. The integrated circuit device of claim 1, further comprising a first insulating spacer and a second insulating spacer between the contact plug and the bit line on the boron-containing insulating pattern, the first insulating spacer and the second insulating spacer comprising different respective materials,
   wherein each of the first insulating spacer and the second insulating spacer is free of boron.

9. The integrated circuit device of claim 8, further comprising an insulating fence extending in the vertical direction on the substrate, the insulating fence being in line with the contact plug in the horizontal direction,
   wherein the first insulating spacer and the second insulating spacer extend between the bit line and the insulating fence.

10. The integrated circuit device of claim 8, wherein each of the first insulating spacer and the second insulating spacer surrounds a perimeter of the contact plug.

11. The integrated circuit device of claim 8, further comprising an insulating fence extending in the vertical direction on the substrate, the insulating fence being in line with the contact plug in the horizontal direction,
    wherein the first insulating spacer and the second insulating spacer extend between the contact plug and the insulating fence.

12. The integrated circuit device of claim 11, further comprising a boron-containing insulating fence between the bit line and the insulating fence.

13. An integrated circuit device comprising:
    a substrate comprising a plurality of active regions spaced apart from each other;
    a bit line extending in a horizontal direction on the substrate;
    a plurality of contact plugs spaced apart from each other along a horizontal line parallel to the bit line on the substrate;
    a plurality of insulating fences that alternate with the plurality of contact plugs in the horizontal direction;
    a direct contact connected between a first active region of the plurality of active regions and the bit line; and
    a boron-containing insulating pattern between a first contact plug of the plurality of contact plugs and the direct contact.

14. The integrated circuit device of claim 13,
    wherein the first contact plug is in contact with a second active region of the plurality of active regions in the substrate, and wherein the first contact plug and the direct contact are both in contact with the boron-containing insulating pattern.

15. The integrated circuit device of claim 13, further comprising an insulating film between the direct contact and the boron-containing insulating pattern and between the first contact plug and the boron-containing insulating pattern,
wherein the insulating film comprises a lower dielectric constant than a dielectric constant of the boron-containing insulating pattern.

16. An integrated circuit device comprising:
a substrate comprising a plurality of active regions;
a bit line extending in a horizontal direction on the substrate;
a direct contact connected between a first active region of the plurality of active regions and the bit line;
a first contact plug and a second contact plug that face each other with the bit line therebetween, wherein the first contact plug and the second contact plug are connected to a second active region and a third active region, respectively, of the plurality of active regions;
a first insulating fence and a second insulating fence that face each other with the bit line therebetween; and
a plurality of boron-containing insulating patterns comprising a first boron-containing insulating pattern between the direct contact and the first contact plug and a second boron-containing insulating pattern between the direct contact and the second contact plug,
wherein each of the plurality of boron-containing insulating patterns comprises a silicon boron nitride (SiBN) film.

17. The integrated circuit device of claim 16,
wherein each of the plurality of boron-containing insulating patterns comprises a dielectric constant of 2 to 6, and
wherein a boron content in the plurality of boron-containing insulating patterns increases toward the direct contact.

18. The integrated circuit device of claim 16,
wherein the first contact plug is in contact with the second active region and the first boron-containing insulating pattern, and
wherein the second contact plug is in contact with the third active region and the second boron-containing insulating pattern.

19. The integrated circuit device of claim 16, further comprising an insulating film between the direct contact and the first boron-containing insulating pattern and between the direct contact and the second boron-containing insulating pattern,
wherein the insulating film comprises a lower dielectric constant than a dielectric constant of at least one of the first boron-containing insulating pattern or the second boron-containing insulating pattern.

* * * * *